United States Patent
Johnston

(10) Patent No.: US 10,909,286 B2
(45) Date of Patent: Feb. 2, 2021

(54) OPTIMIZATION TECHNIQUES FOR QUANTUM COMPUTING DEVICE SIMULATION

(71) Applicant: PsiQuantum Corp., Palo Alto, CA (US)

(72) Inventor: Eric Roy Johnston, San Francisco, CA (US)

(73) Assignee: PsiQuantum Corp., Palo Alto, CA (US)

( * ) Notice: Subject to any disclaimer, the term of this patent is extended or adjusted under 35 U.S.C. 154(b) by 437 days.

(21) Appl. No.: 15/880,299

(22) Filed: Jan. 25, 2018

(65) Prior Publication Data

US 2018/0210985 A1 Jul. 26, 2018

Related U.S. Application Data

(60) Provisional application No. 62/450,656, filed on Jan. 26, 2017.

(51) Int. Cl.
  *G06F 30/33* (2020.01)
  *G06F 3/06* (2006.01)
  *G06N 10/00* (2019.01)

(52) U.S. Cl.
  CPC ............ *G06F 30/33* (2020.01); *G06F 3/0604* (2013.01); *G06F 3/0631* (2013.01); *G06F 3/0673* (2013.01); *G06N 10/00* (2019.01)

(58) Field of Classification Search
  CPC ...... G06F 30/33; G06F 3/0604; G06F 3/0673; G06F 3/0631; G06N 10/00
  USPC .......................................................... 703/21
  See application file for complete search history.

(56) References Cited

U.S. PATENT DOCUMENTS

| 6,578,018 B1* | 6/2003 | Ulyanov ................ B82Y 10/00 |
| | | 706/14 |
| 10,325,218 B1* | 6/2019 | Zeng ...................... G06N 20/00 |
| 2005/0182614 A1* | 8/2005 | Meredith ............... B82Y 10/00 |
| | | 703/21 |

(Continued)

OTHER PUBLICATIONS

Maity et al. "Design of an Efficient Quantum Circuit Simulator", 2010 International Symposium on Electronic System Design, IEEE, pp. 50-55. (Year: 2010).*

(Continued)

*Primary Examiner* — Suzanne Lo
(74) *Attorney, Agent, or Firm* — Morgan, Lewis & Bockius LLP

(57) ABSTRACT

Computer systems and methods are provided for increasing a rate of simulation for quantum computing devices. A quantum computing device includes a plurality of gates, each of which is coupled to one or more modes. In the provided computer systems and methods, a device definition and state information for the quantum computing device are received. The state information includes a plurality of input patterns, each of which indicates a number of input bosons that correspond to a respective mode of the quantum computing device, and an amplitude that corresponds to each input pattern. The device definition includes a plurality of sets of gate values that indicate modification by a respective gate of an input pattern probability. A first group of input patterns is generated for a first gate. The first group of input patterns includes a subset of the plurality of input patterns that meet grouping criteria.

16 Claims, 27 Drawing Sheets

(56) References Cited

U.S. PATENT DOCUMENTS

2014/0039866 A1* 2/2014 Wecker ............... G06F 9/455
703/21

OTHER PUBLICATIONS

Stallings, William. "Chapter 12 File Management", Operating Systems, Internals and Design Principles, Sep. 2, 2014, 73 pages, Accessed at https://www.unf.edu/public/cop4610/ree/Notes/PPT/PPT8E/CH12-OS8e.pdf (Year: 2014).*

* cited by examiner

Beamsplitter gate definition 302a $$\frac{1}{\sqrt{2}}\begin{bmatrix} 1 & 1 \\ 1 & -1 \end{bmatrix}$$

Figure 3A

Beamsplitter gate definition 302b $$\frac{1}{\sqrt{2}}\begin{bmatrix} 1 & i \\ i & 1 \end{bmatrix}$$

Figure 3B

Phase shift ($R_\phi$) gate definition 304

$$\begin{bmatrix} 1 & 0 \\ 0 & e^{i\phi} \end{bmatrix}$$

Figure 3C

Swap gate definition 306

$$\begin{bmatrix} 0 & 1 \\ 1 & 0 \end{bmatrix}$$

Figure 3D

CNOT gate definition 308

$$\begin{bmatrix} 1 & 0 & 0 & 0 \\ 0 & 1 & 0 & 0 \\ 0 & 0 & 0 & 1 \\ 0 & 0 & 1 & 0 \end{bmatrix}$$

Figure 3E

Modified Group 508
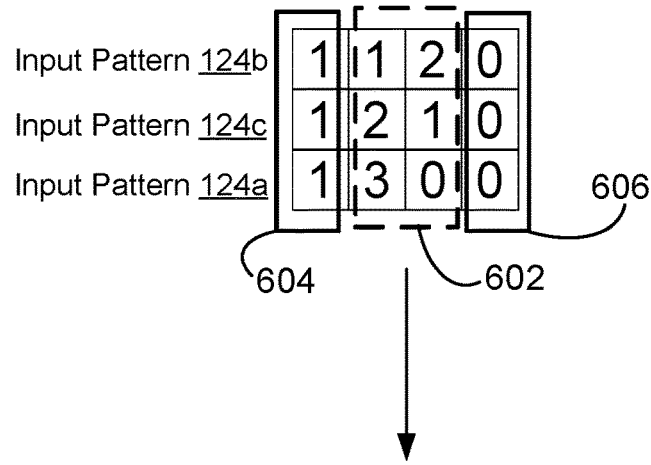
Full set of patterns for active modes 902
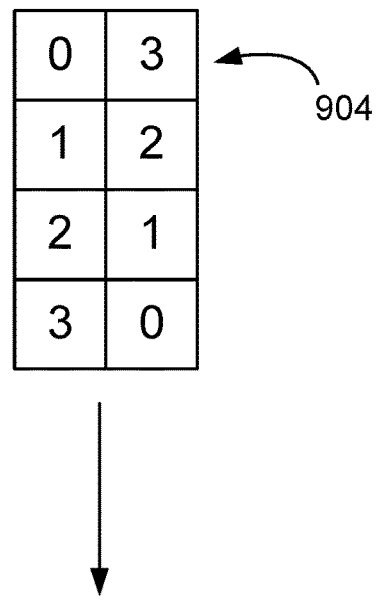
Derived output patterns 906
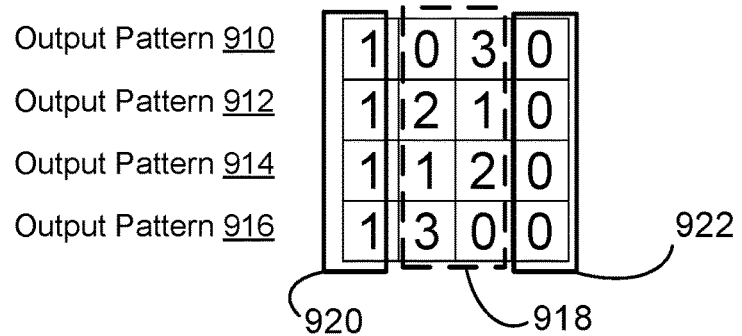
Figure 9

$$\underset{1302}{\longrightarrow}\begin{bmatrix} a & b & c \\ d & e & f \\ g & h & k \end{bmatrix}$$

$$a(ek+hf) + b(dk+gf) + c(dh+ge) \underset{1306}{\longleftarrow}$$

$$\underset{1304}{\longrightarrow}\begin{bmatrix} a & a & a \\ a & e & e \\ a & e & e \end{bmatrix} \underset{1308}{\longrightarrow}$$

1502
Receive a device definition for a quantum computing device, wherein:
  the quantum computing device includes a plurality of gates and a plurality of modes;
  each gate of the plurality of gates is coupled to a respective set of one or more of the plurality of modes; and
  the device definition includes a plurality of sets of gate values, wherein a respective set of gate values indicates modification by a respective gate of an input pattern probability

1504
Receive state information, which includes:
  a plurality of input patterns, wherein each of the input patterns includes a respective plurality of input pattern values, wherein each input pattern value of the plurality of input pattern values indicates a number of input bosons that correspond to a respective mode of the plurality of modes; and
  a plurality of amplitudes, wherein each respective amplitude of the plurality of amplitudes indicates a respective probability associated with a respective input pattern of the plurality of input patterns

1506
Generate a first group of input patterns for a first gate, wherein the first group of input patterns includes a subset of the plurality of input patterns that meet grouping criteria

1508
A first criterion of the grouping criteria is satisfied in accordance with a determination that passive elements of the input patterns are identical, wherein passive elements for the first gate are input pattern values that correspond to respective modes that are not coupled to the first gate; and a second criterion of the grouping criteria is satisfied in accordance with a determination that sums of active elements of the input patterns are equal, wherein active elements for the first gate are input pattern values that correspond to respective modes that are coupled to the first gate

1510
Generating the first group of input patterns for the first gate includes ordering the input patterns in the first group of input patterns according to the active elements corresponding to a first mode of the first gate

1512
The first gate is coupled to a first set of one or more modes of the plurality of modes, and generating the first group of input patterns comprises:
 in accordance with a determination that a second gate is a single mode gate that is coupled to a single mode from the plurality of modes:
  determine a set of elements of the first group of input patterns that correspond to the single mode;
  in accordance with a determination that each element in the set of elements is passive and zero, forgo determining a representative output value that corresponds to the second gate;
  in accordance with a determination that each element in the set of elements is passive and non-zero, determine a representative output value using a respective input pattern of the plurality of input pattern values; and
  in accordance with a determination that each element of the set of elements is active, determine a representative output value using each non-zero element of the set of elements

---

1514
Detect N identical input patterns of the plurality of input patterns, wherein N is an integer greater than one;
remove, from the plurality of input patterns, N-1 of the N identical input patterns such that a single input pattern of the N identical input patterns remains in the plurality of input patterns; and
set an amplitude of the single remaining input pattern to a sum of amplitudes of the N identical input patterns

---

1516
Store, in a first portion of memory, the plurality of input pattern values that correspond to the input state; and
reference a respective input pattern of the input state using a first index

1532
For each gate and for each respective input pattern in the first group of input patterns:
    generate a respective set of gate-input-pattern values by combining the respective input pattern with the respective gate; and
    for each output pattern of a set of output patterns derived from the first group of input patterns:
        generate a set of gate-output-pattern values by applying the respective output pattern to the respective set of gate-input-pattern values;
        search for a stored set of values that meets matching criteria for the respective set of gate-input-pattern values;
        in accordance with a determination that a stored set of values meeting the matching criteria for gate-input-pattern values is found, use the stored set of values to determine a representative output value that corresponds to the respective set of gate-output-pattern values;
        in accordance with a determination that no stored set of values meets the matching criteria for gate-input-pattern values, calculate a representative output value that corresponds to the respective set of gate-output-pattern values;
        generate a modified representative output value by applying the amplitude of the respective input pattern to the representative output value; and
        add the modified representative output value to a respective total representative output value for the respective output pattern

1602
Receive a device definition for a quantum computing device, wherein:
　　the quantum computing device includes a plurality of gates and a plurality of modes;
　　each gate of the plurality of gates is coupled to one or more of the plurality of modes; and
　　the device definition includes a plurality of sets of gate values, wherein each set of gate values indicates modification by a respective gate of a probability that corresponds to a respective input pattern

1604
Receive state information for the quantum computing device, including:
　　an input state for the quantum computing device comprising a plurality of input patterns, wherein:
　　　　each input pattern of the plurality of input patterns includes a plurality of input pattern values; and
　　　　each of the input pattern values indicates:
　　　　　　a respective number of input bosons that correspond to a respective mode of the plurality of modes of the quantum computing device, and
　　　　　　a respective amplitude corresponding to a probability associated with the respective input pattern value

1606
For each gate of the plurality of gates:
　　search for a respective predetermined set of gate values that corresponds to the respective gate;
　　in accordance with a determination that a respective predetermined set of gate values that correspond to the respective gate is found, determine a respective output value for each input pattern of the plurality of input patterns using the predetermined set of gate values; and
　　in accordance with a determination that a respective predetermined set of gate values that correspond to the respective gate is not found, generate a respective group of input patterns for the respective gate, wherein the respective group of input patterns includes a subset of the plurality of input patterns that meet grouping criteria

Figure 16

OPTIMIZATION TECHNIQUES FOR QUANTUM COMPUTING DEVICE SIMULATION

RELATED APPLICATIONS

This application is a non-provisional application of and claims priority to U.S. Provisional Patent Application No. 62/450,656, filed Jan. 26, 2017, entitled, "Method for Quantum Optics Simulation," which is hereby incorporated by reference in its entirety.

TECHNICAL FIELD

This application relates generally to quantum computing simulations, and more particularly to topology-driven analysis of a quantum computing device to increase simulation efficiency.

BACKGROUND

Systems for simulating quantum logic are used for the design and simulation of quantum computers and other logic devices, as well as advanced optical systems. However, existing systems for simulating quantum logic are limited by computational load requirements that increase rapidly as the size and complexity of the device being simulated increases. Accordingly, there is a need for methods and devices that improve the efficiency of simulating quantum devices.

SUMMARY

Some embodiments described herein use a device definition for a quantum computer and input state information to simulate an output state of a quantum computing device. In contrast with approaches to simulation that involve constructing a full unitary matrix that represents all gates in a quantum computing device, the techniques described herein involve analyzing the effects of individual gates on the state of the quantum computing device. Structuring a quantum logic problem based on the local topology of a quantum computing device allows utilization of optimization techniques that cause simulations to be performed with greater speed and decreased memory consumption.

In one aspect, some embodiments include a method for increasing a rate of simulation for quantum computing devices. The method includes receiving a device definition for a quantum computing device. The quantum computing device includes a plurality of gates and a plurality of modes. Each gate of the plurality of gates is coupled to a respective set of one or more of the plurality of modes. The device definition includes a plurality of sets of gate values, wherein a respective set of gate values indicates modification by a respective gate of an input pattern probability. The method also includes receiving state information, which includes a plurality of input patterns. Each of the input patterns includes a respective plurality of input pattern values. Each input pattern value of the plurality of input pattern values indicates a number of input bosons that correspond to a respective mode of the plurality of modes. The state information also includes a plurality of amplitudes. Each respective amplitude of the plurality of amplitudes indicates a probability associated with a respective input pattern of the plurality of input patterns. The method also includes generating a first group of input patterns for a first gate. The first group of input patterns includes a subset of the plurality of input patterns that meet grouping criteria.

In another aspect, some embodiments include a system having one or more processors, memory, and one or more programs. The one or more programs are stored in the memory and are configured for execution by the one or more processors, the one or more programs including instructions for: receiving a device definition for a quantum computing device. The quantum computing device includes a plurality of gates and a plurality of modes. Each gate of the plurality of gates is coupled to a respective set of one or more of the plurality of modes. The device definition includes a plurality of sets of gate values. A respective set of gate values indicates modification by a respective gate of an input pattern probability. The one or more programs additionally include instructions for receiving state information, which includes a plurality of input patterns. Each of the input patterns includes a respective plurality of input pattern values. Each input pattern value of the plurality of input pattern values indicates a number of input bosons that correspond to a respective mode of the plurality of modes. The state information also includes a plurality of amplitudes. Each respective amplitude of the plurality of amplitudes indicates a probability associated with a respective input pattern of the plurality of input patterns. The one or more programs additionally include instructions for generating a first group of input patterns for a first gate, wherein the first group of input patterns includes a subset of the plurality of input patterns that meet grouping criteria.

In another aspect, some embodiments include a computer readable storage medium storing one or more programs, the one or more programs comprising instructions, which when executed, cause a device to receive a device definition for a quantum computing device. The quantum computing device includes a plurality of gates and a plurality of modes. Each gate of the plurality of gates is coupled to a respective set of one or more of the plurality of modes. The device definition includes a plurality of sets of gate values. A respective set of gate values indicates modification by a respective gate of an input pattern probability. The one or more programs additionally include instructions that cause a device to receive state information, which includes a plurality of input patterns. Each of the input patterns includes a respective plurality of input pattern values. Each input pattern value of the plurality of input pattern values indicates a number of input bosons that correspond to a respective mode of the plurality of modes. The state information also includes a plurality of amplitudes. Each respective amplitude of the plurality of amplitudes indicates a probability associated with a respective input pattern of the plurality of input patterns. The one or more programs additionally include instructions that cause a device to generate a first group of input patterns for a first gate, wherein the first group of input patterns includes a subset of the plurality of input patterns that meet grouping criteria.

Thus, devices and systems are provided with methods for quantum computing device simulation, thereby increasing the effectiveness, efficiency, and user satisfaction with such systems and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

FIGS. 3A-3E are examples of gate definitions, in accordance with some embodiments.

FIG. 9 illustrates deriving a set of output patterns from a group of input patterns, in accordance with some embodiments.

FIG. 13 illustrates examples of reduced operations and memory accesses for matrices with repeated values, in accordance with some embodiments.

FIGS. 15A-15F provide a detailed flow chart for a method of increasing a rate of simulation for quantum computing devices, in accordance with some embodiments.

FIG. 16 is a flow chart for a method of increasing a rate of simulation for quantum computing devices that include gates with predetermined sets of gate values, in accordance with some embodiments.

DETAILED DESCRIPTION

Figure 1:
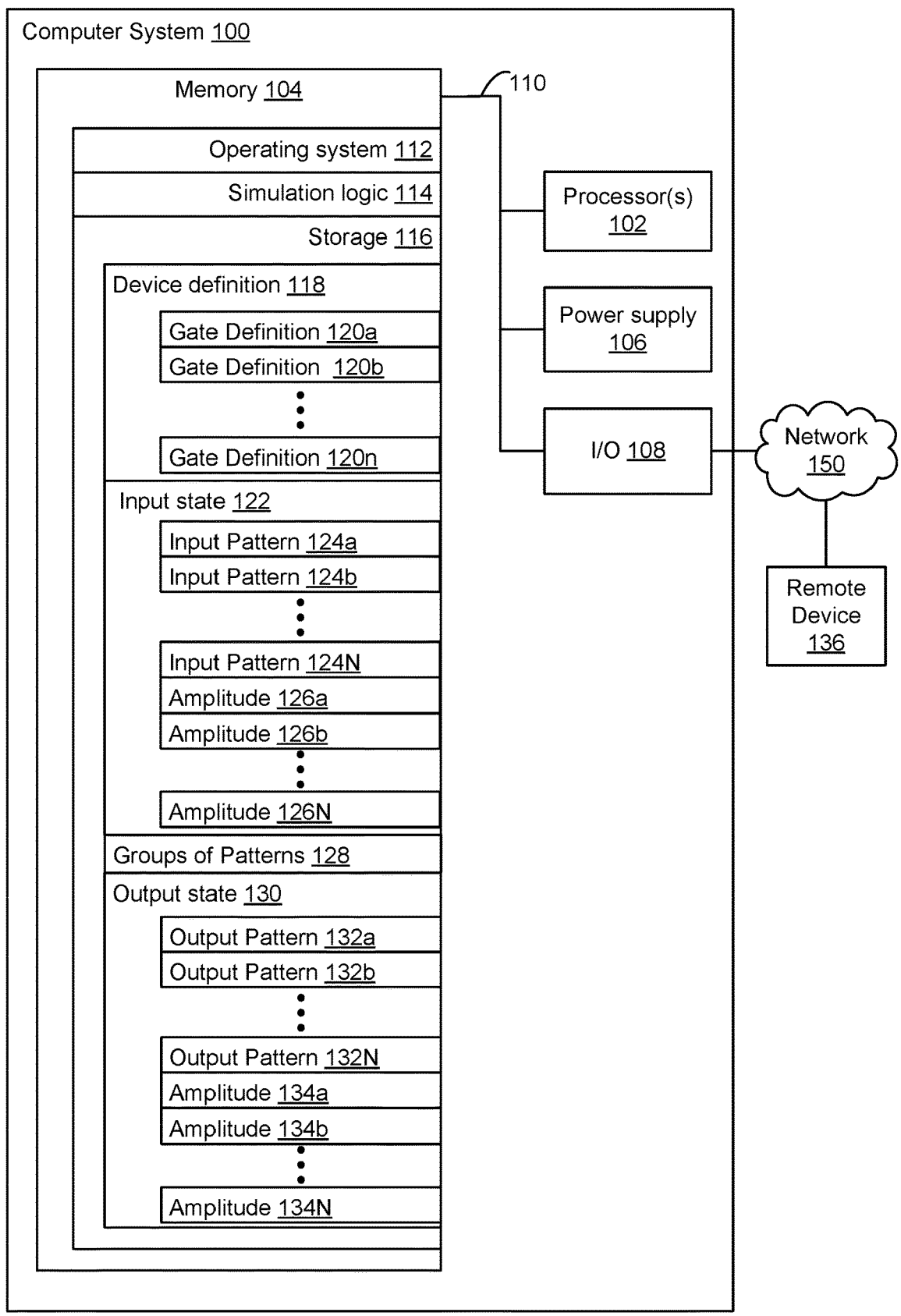
FIG. 1 is a system diagram illustrating a classical computer used for simulating quantum computing devices, in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

As used herein, a "mode" is an input to a device (e.g., a gate and/or a quantum computing device that consists of multiple gates). In some embodiments, a mode is an optical mode (e.g., used to control or identify distinguishing characteristics of bosons). For example, an optical mode is defined by a set of physical degrees of freedom of one or more photons. In some embodiments, an optical mode is defined by a set of all physical degrees of freedom of the one or more photons. In some embodiments, an optical mode is defined by specifying, for each photon in the one or more photons, one or more of: a frequency, a spatial extent (e.g., which channel or superposition of channels the photon is localized within), an associated direction of spatial propagation (e.g., a direction along the channel or superposition of channels the photon is travelling), a polarization (e.g., of the photon's electric and/or magnetic fields), temporal extent, and an orbital angular momentum (e.g., a direction of the photon's spin). In some embodiments, optical modes take the form of waveguides that use refractive index boundaries in a material to guide the paths of the photons. Any number of photons may occupy a single mode. In some embodiments, a mode is an input to a superconducting quantum computing system or other quantum computing system.

As used herein, the term "pattern" is a set of values, wherein a value indicates a number of bosons (e.g., photons) present in a mode. The sum of the values in a pattern is equal to the number of photons present in a quantum computing device.

As used herein, the term "amplitude" is a complex number. The squared magnitude of the amplitude indicates the probability that corresponds to a pattern.

As used herein, the term "state" is a set of one or more patterns. Each pattern in the state has a corresponding amplitude. In some embodiments, the sum of the probabilities that correspond to amplitudes of patterns in a state is equal to 1.

As used herein, the term "gate" is a device that operates on one or more modes (e.g., by acting on photons within those modes). For example, a gate (e.g., a beamsplitter or a phase shift gate) modifies the probabilities of some or all of the patterns in a state.

As used herein, the term "quantum computing device" is a set of one or more gates that are included in a device definition (e.g., a device definition to be simulated by a quantum simulation device executed by a classical (non-quantum) computer).

FIG. 1 is a system diagram illustrating a classical computer system 100 (e.g., a server, a desktop computer, and/or a laptop computer) used for simulating quantum computing devices, in accordance with some embodiments. Computer system 100 typically includes a memory 104, one or more processor(s) 102, a power supply 106, an input/output (I/O) subsystem 108, and a communication bus 110 for interconnecting these components. The processor(s) 102 execute modules, programs, and/or instructions stored in memory 104 and thereby perform processing operations. In some embodiments, the one or more processor(s) 102 and/or memory 104 of the computer system 100 include hardware that is optimized for complex manipulations. The efficiency of calculating amplitude transfer values and other values as described herein is improved by rapid manipulation of complex numbers, which are equivalent to two-dimensional vectors. By providing hardware that is optimized for complex manipulations (addition, subtraction, multiplication, squared magnitude, etc.) supported by the applied computing hardware, the time required for performing the operations described below with regard to methods 1400, 1500, and 1600 is reduced. In some embodiments, complex numbers or other data structures are stored in particular memory locations to enable rapid access and efficient data storage.

In some embodiments, memory 102 stores one or more programs (e.g., sets of instructions) and/or data structures. In some embodiments, memory 102, or the non-transitory computer readable storage medium of memory 102 stores the following programs, modules, and data structures, or a subset or superset thereof:

an operating system 112;
simulation logic 114;
and storage 116 including buffer(s), RAM, ROM, and/or other memory that stores data used and generated by the simulation logic 114, including a device definition 118, which stores information (e.g., device identifiers and/or sets of values (e.g, arrays)) for one or more gates 120 (e.g., gate 120a, gate 120b . . . gate 120N) of the simulated device; input state information 122 indicating a set of one or more input patterns 124 that specify a number of bosons (e.g., photons) that are input at each mode of the quantum computing device (e.g., input pattern 124a, input pattern 124b, . . . input pattern 124N) and corresponding amplitudes (e.g., amplitude 126a, amplitude 126b . . . amplitude 126N); information indicating one or more groups of patterns 128 derived from a set of patterns; and output state information 130 indicating a determined set of output states (e.g., output pattern 132a, output pattern 132b, . . . output pattern 132N) and corresponding amplitudes (e.g., amplitude 134a, amplitude 134b . . . amplitude 134N).

The above identified modules (e.g., data structures and/or programs including sets of instructions) need not be implemented as separate software programs, procedures, or modules, and thus various subsets of these modules may be combined or otherwise re-arranged in various embodiments. In some embodiments, the memory 104 stores a subset of the modules identified above. Furthermore, the memory 104 may store additional modules not described above. In some embodiments, the modules stored in the memory 104, or a non-transitory computer readable storage medium of the memory 104, provide instructions for implementing respective operations in the methods described below. In some embodiments, some or all of these modules may be implemented with specialized hardware circuits that subsume part or all of the module functionality. One or more of the above identified elements may be executed by one or more of the processor(s) 102.

In some embodiments, the I/O subsystem 108 communicatively couples the computing system 100 to one or more devices, such as one or more remote device(s) 136 (e.g., one or more device(s) from which a device definition 118 and/or an input state 122 are received and/or to which an output state 130 is transmitted) via a communications network 150 and/or via a wired and/or wireless connection. In some embodiments, the communications network 150 is the Internet. In some embodiments, the I/O subsystem 108 communicatively couples the computing system 100 one or more peripheral devices, such as an input device (e.g., a mouse, keyboard, local data storage device) and/or an output device (e.g., a display device).

The communication bus 110 optionally includes circuitry (sometimes called a chipset) that interconnects and controls communications between system components.

Figure 2:
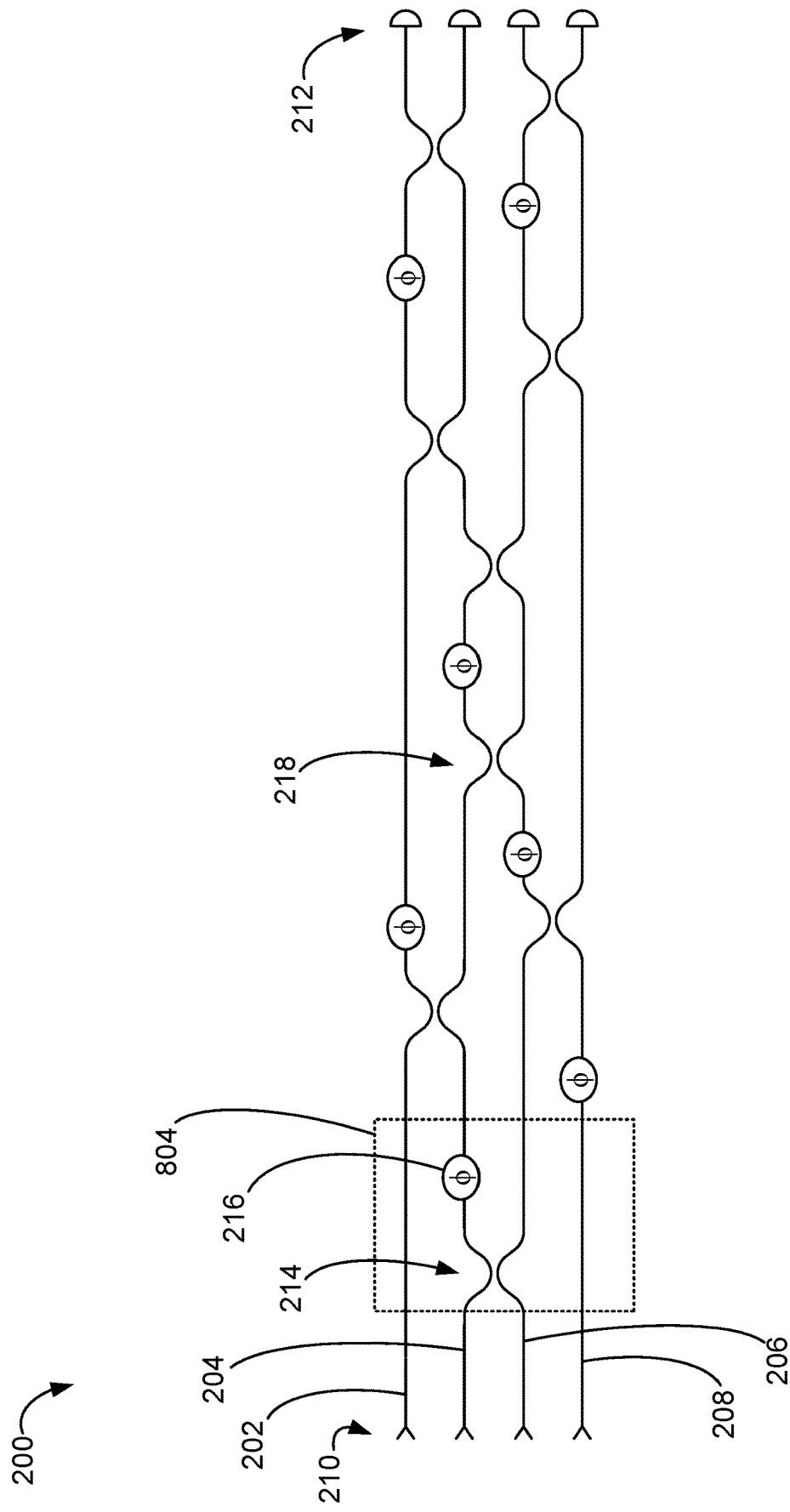
FIG. 2 illustrates a diagram that indicates gates and modes of a quantum computing device, in accordance with some embodiments.

FIG. 2 illustrates a diagram 200 that indicates gates and modes of a quantum computing device, in accordance with some embodiments. The device includes a first mode 202, a second mode 204, a third mode 206, and a fourth mode 208. Photons enter the device at an input of the mode, as indicated at 210 and exit the device at an output of the mode, as indicated at 212. As photons pass through the modes, gates, such as beamsplitters (e.g., beamsplitter 214) and phase shift gates (e.g., phase shift gate 216) operate on the photons. For example, beamsplitter 214 operates on the second mode 204 and the third mode 206 (as indicated in diagram 200 by the connection of beamsplitter 214 to the second mode 204 and the third mode 206). Phase shift gate 216 operates on the second mode 204.

FIGS. 3A-3E are examples of gate definitions 120, in accordance with some embodiments. In some embodiments, a gate definition 120 is a set of values (e.g., expressed as a matrix) that indicates operations performed by one or more modes. FIGS. 3A and 3B illustrate common forms of definitions for beamsplitter gates (some beamsplitter gates may also be referred to as a Hadamard gate). For example, beamsplitter 214 may have a definition as indicated at FIG. 3A or as indicated at FIG. 3B. FIG. 3A is a first example 302a of a beamsplitter gate definition and FIG. 3B is a second example 302b of a beamsplitter gate definition. FIG. 3C is a phase shift gate definition 304 for a phase shift gate (e.g., phase shift gate 216) that causes a phase shift by the angle $\phi$. FIG. 3D is a swap gate definition 306 for a swap gate. FIG. 3E is a CNOT gate definition 308 for a CNOT gate.

Figure 4:
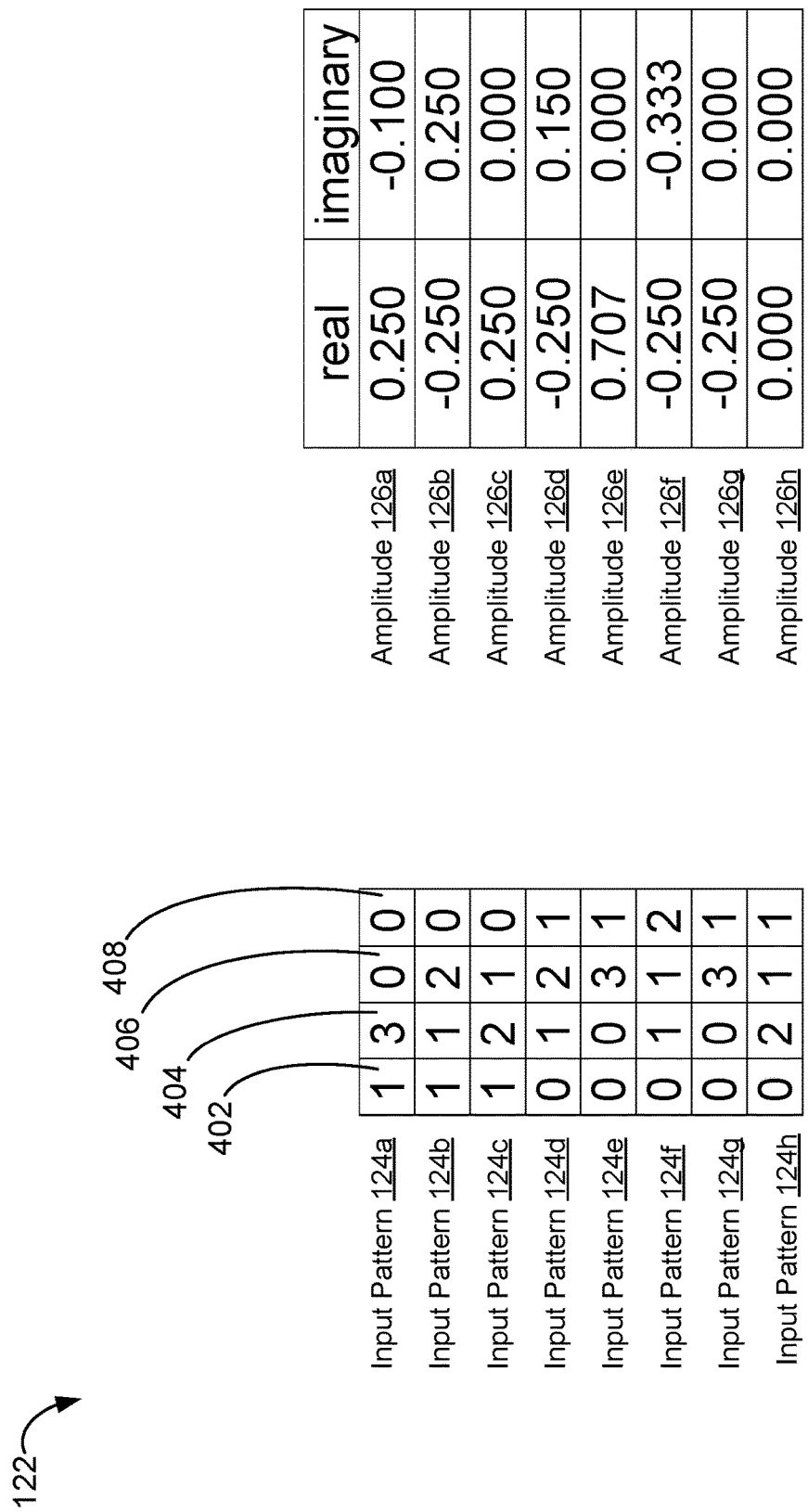
FIG. 4 illustrates an example of an input state, in accordance with some embodiments.

FIG. 4 illustrates an example of an input state 122, in accordance with some embodiments. Input state 122 includes a set of input patterns (e.g., input patterns 124a-124h). An input pattern includes a set of values, each of which indicates a number of bosons (e.g., photons) present in a respective mode. In input pattern 124a, the value "1" at pattern element 402 indicates that one photon is present at the input to the first mode 202, the value "3" at pattern element 404 indicates that three photons are present at the input to the second mode 204, the value "0" at pattern element 406 indicates that no photons are present at the input to the third mode 206, and the value "0" at pattern element 408 indicates that no photons are present at the input to the fourth mode 208. Each input pattern has an amplitude (e.g., a complex number that includes a real component and an imaginary component) that corresponds to the probability of the input pattern. For example, input pattern 124a has an amplitude 126a (0.250+0.150i). The probability that corresponds to amplitude 126a is the squared magnitude of the amplitude (e.g., the probability that corresponds to amplitude 126a is $(0.250)^2+(-0.100)^2=0.0725$). The sum of the probabilities in input state 122 are equal to one. In some embodiments, the amplitudes of an input state 112 and/or output state 130 are normalized such that the sum of the probabilities of the patterns in the state is equal to one.

In some embodiments, determination by simulation logic 114 of the effects of the gates of a quantum computing device on the input state 122 involves determining, for each gate of the quantum computing device, one or more groups of patterns from among the set of input patterns 124.

Figure 5:
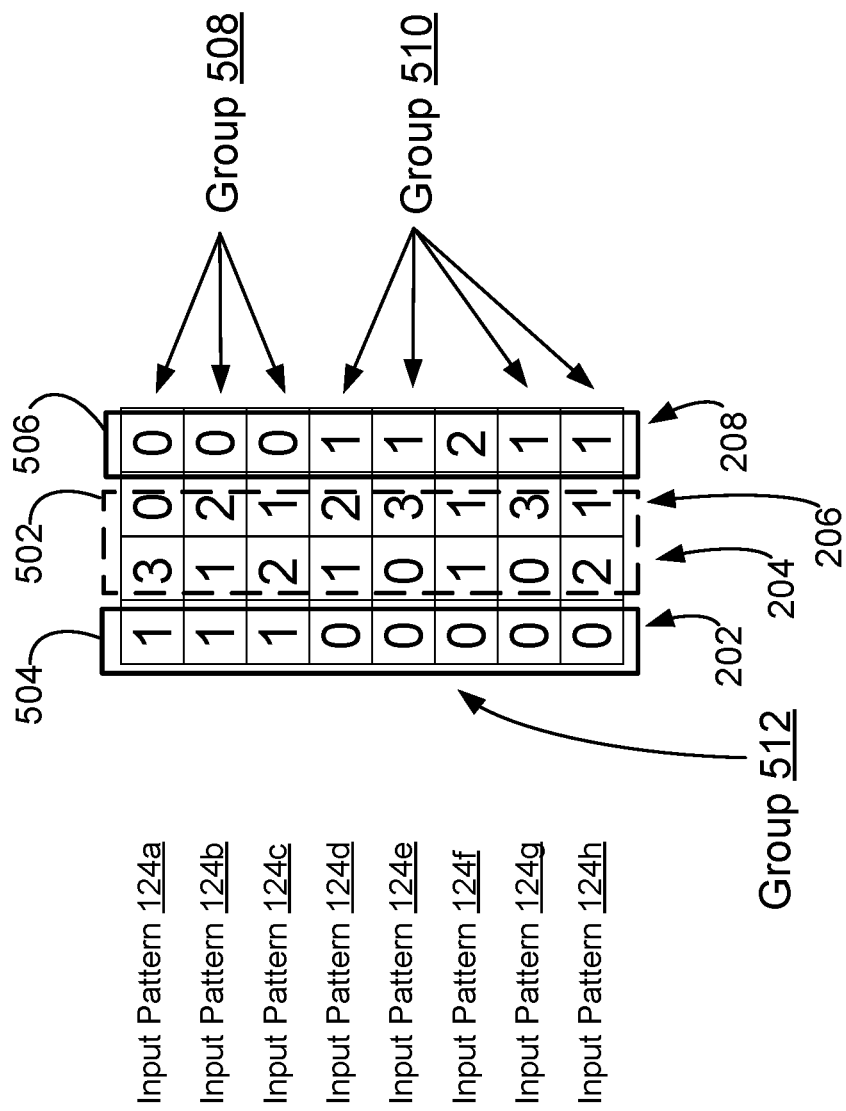
FIG. 5 illustrates groups of input patterns determined from a set of input patterns for gate, in accordance with some embodiments.

FIG. 5 illustrates input pattern groups 128 for a gate (e.g., beamsplitter gate 214) derived from a set of patterns (e.g., input patterns 124a-124h) of a state (e.g., input state 122), in accordance with some embodiments. Determining the input pattern groups 128 from among the set of input patterns includes determining active elements and passive elements for the gate. An active element of an input pattern 124 is an element that corresponds to a mode that is operated on by a gate. For example, because beamsplitter gate 214 operates on second mode 204 and third mode 206 of the device indicated by diagram 200, the active elements of input patterns 124a-124h are the elements that correspond to the second mode 204 and the third mode 206. The active elements of input patterns 124a-124h are shown within box 502 (indicated with a dotted line). A passive element of an input pattern is an element that corresponds to a mode that is not operated on by a gate. For example, because beamsplitter gate 214 does not operate on first mode 202 and/or fourth mode 208 of the device indicated by diagram 200, the passive elements of input patterns 124a-124h are the elements that correspond to the first mode 202 and the fourth mode 208. The passive elements of input patterns 124a-124h are shown within boxes 504 and 506 (indicated with a solid line).

A group of input patterns for a gate includes all input patterns (from the set of all input patterns in the input state) for which:
all passive elements in the input patterns are identical, and the sum of all active elements in each of the input patterns are equal.

For example, in input state 122 for gate 214, there are three groups: a first group 508 that includes input patterns 124a, 124b, and 124c, a second group 510 that includes input patterns 124d, 124e, 124g, and 124h, and a third group 512 that includes input pattern 124f. For the input patterns in first group 508, the passive elements (shown in boxes 504 and 506) are identical, because the value of the element in box 504 is "1" and the value of the element in box 506 is "0" for each of input patterns 124a, 124b, and 124c. The sums of the active elements (shown in box 502) for the input patterns in first group 508 are equal, because 3+0 in input pattern 124a, 1+2 in input pattern 124b, and 2+1 in input pattern 124c are all equal to 3. For the input patterns in second group 510, the passive elements (shown in boxes 504 and 506) are identical, because the value of the element in box 504 is "0" and the value of the element in box 506 is "1" for each of input patterns 124d, 124e, 124g, and 124h. The sums of the active elements (shown in box 502) for the input patterns in second group 510 are equal, because 1+2 in input pattern 124d, 0+3 in input pattern 124e, 0+3 in input pattern 124g, and 2+1 in input pattern 124h are all equal to 3.

Figure 6:
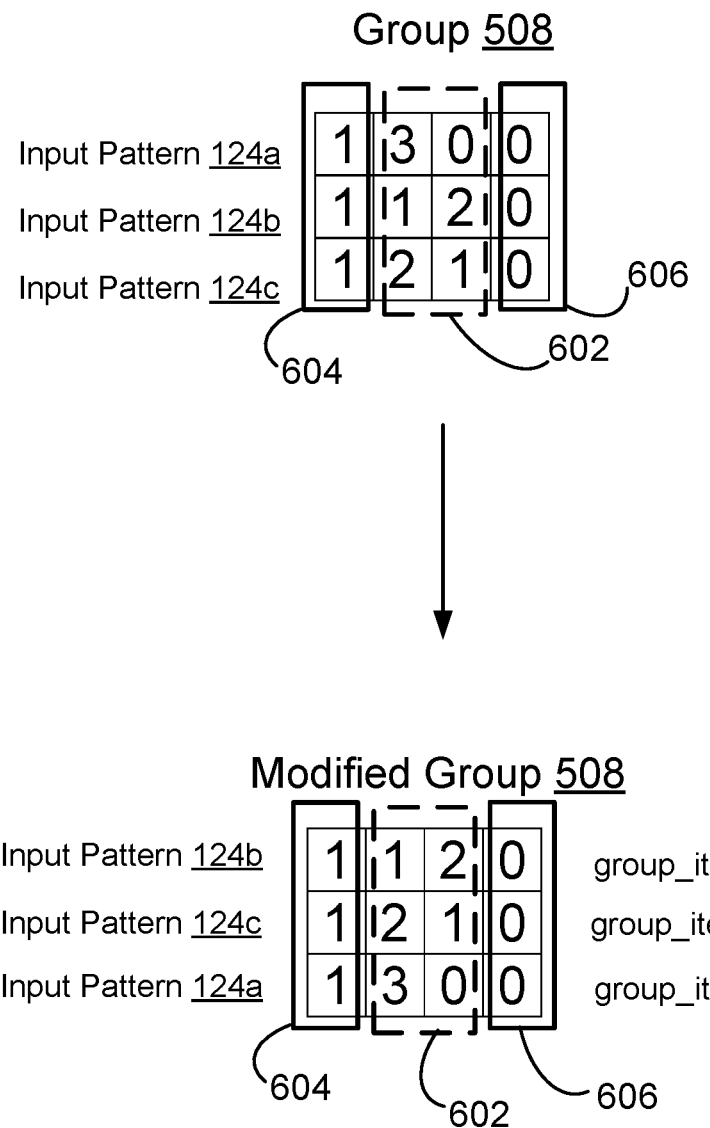
FIG. 6 illustrates re-ordering input patterns in a group of input patterns, in accordance with some embodiments.

FIG. 6 illustrates re-ordering input patterns in a group of input patterns, in accordance with some embodiments. Re-ordering input patterns in a group of input patterns increases the speed with which an input pattern within a group is accessed (e.g., by eliminating the need to search for an input pattern within a group).

Because beamsplitter 214 operates on the second mode 204 and the third mode 206 of the quantum computing device indicated by diagram 200, the second mode 204 and the third mode 206 are active modes for the gate that corresponds to group 508. In FIG. 6, the active elements of group 508 (e.g., the elements that correspond to the second mode 204 and the third mode 206 of the input patterns in the group) are [3,0] in input pattern 124a, [1,2] in input pattern 124b, and [2,1] in input pattern 124c (e.g., as indicated in the box 602). The passive elements of group 508 are indicated in boxes 604 and 606. Group 508 is modified such that one of the active elements of the input patterns in the group is ordered sequentially. For example, in modified group 508, input pattern 124a follows input pattern 124b and 124c, such that the active elements that correspond to the second mode 204 are in ascending order (e.g., [1,2] for input pattern 124b, [2,1] for input pattern 124c, and [3,0] for input pattern 124a). Modifying the order of input patterns in the group allows reference by number in a sequence to a member of the group. This enables an input pattern in the group and/or an amplitude associated with an input pattern in the group to be referenced by the position of the input pattern within the ordered group. For example, an array group_items that includes references to the input patterns can be used to access an input pattern from the group by index (e.g., input pattern 124a is accessed using the index group_items[2]).

Figure 7:
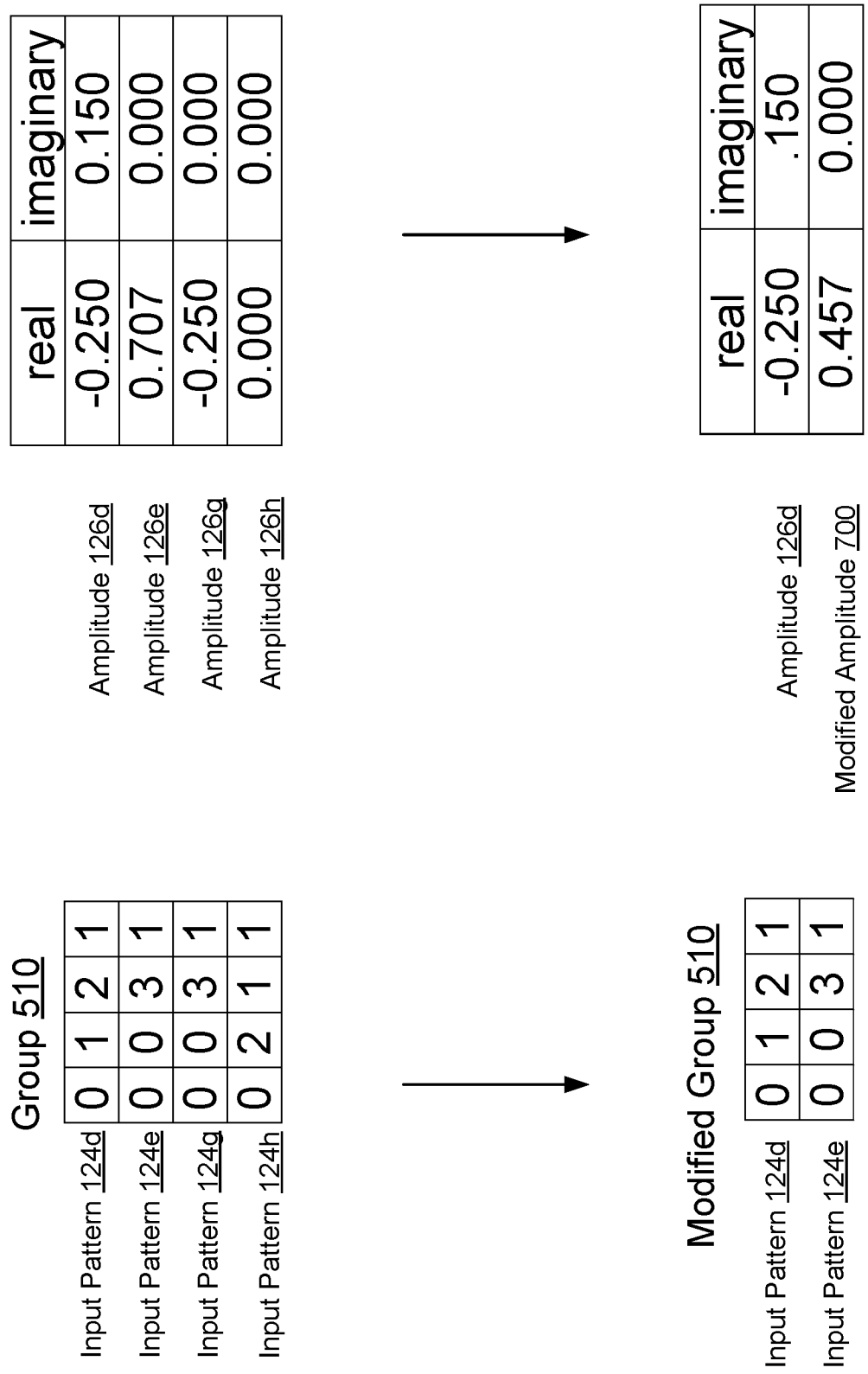
FIG. 7 illustrates removing redundant input patterns from a group and removing input patterns with zero amplitude from a group, in accordance with some embodiments.

FIG. 7 illustrates removing redundant input patterns from a group and removing input patterns with zero amplitude from a group, in accordance with some embodiments. In some embodiments, when multiple input patterns in a group have identical sets of values, input patterns that have the identical sets of patterns are removed from the group until a single input pattern with the set of values remains. The amplitude of the removed identical sets of input patterns are added to the remaining input pattern. For example, in group 510, input pattern 124e and input pattern 124g both includes the values [0, 0, 3, 1]. A modified group 510 is produced in which duplicate input pattern 124g is removed such that a single input pattern with the values [0,0,3,1] remains in the group. The amplitude of removed input pattern 124g is added to the amplitude of remaining input pattern 124e, as indicated at modified amplitude 700.

In some embodiments, an input pattern that has an amplitude of zero and/or an amplitude within a predefined range of zero is removed from the group. For example, as shown in FIG. 7, input pattern 124h has an amplitude of (0+0i). Because input pattern 124h has an amplitude of zero, input pattern 124h is removed from the group as shown in modified group 510.

Figure 8:
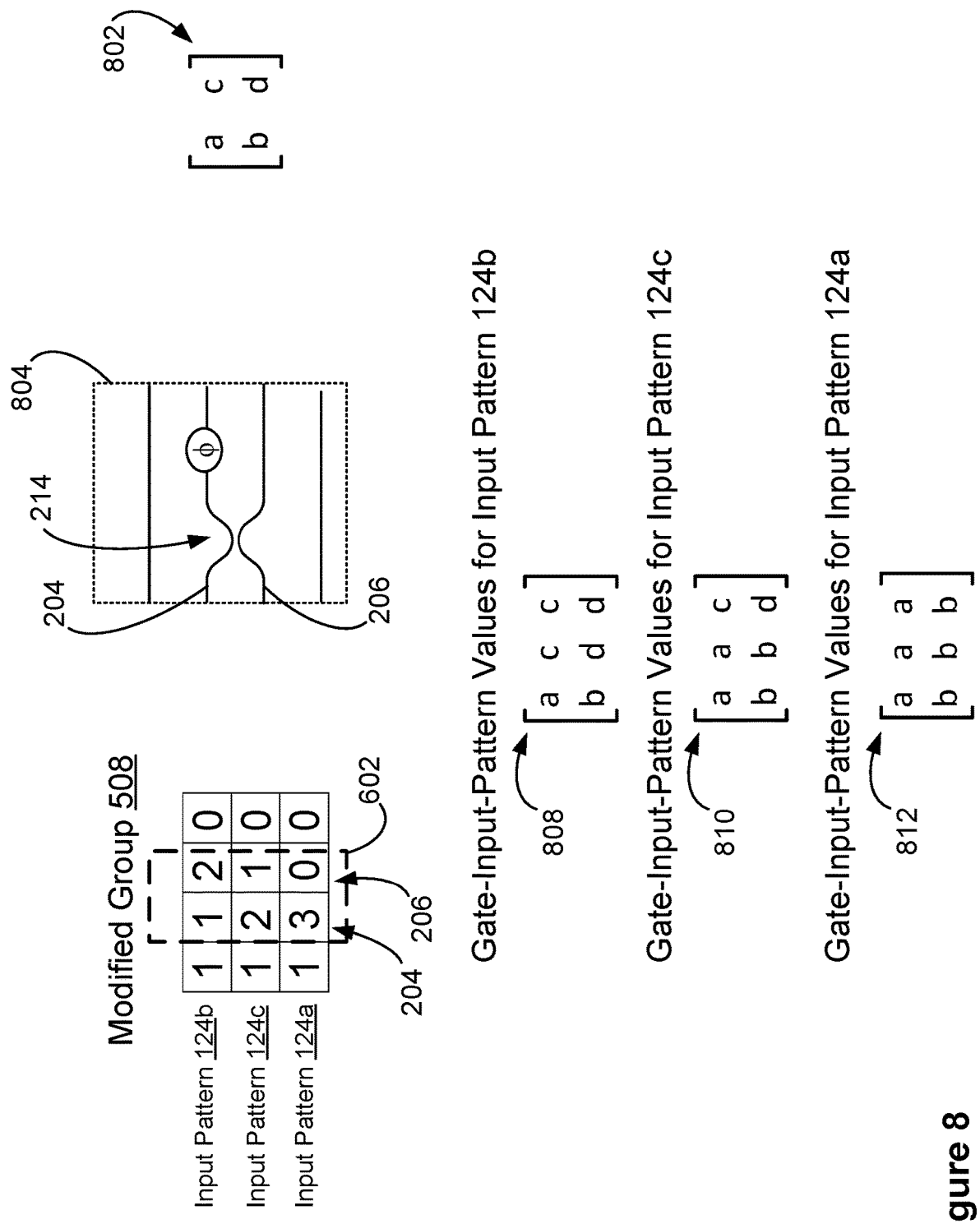
FIG. 8 illustrates determination of a set of gate-input-pattern values, in accordance with some embodiments.
Figure 10:
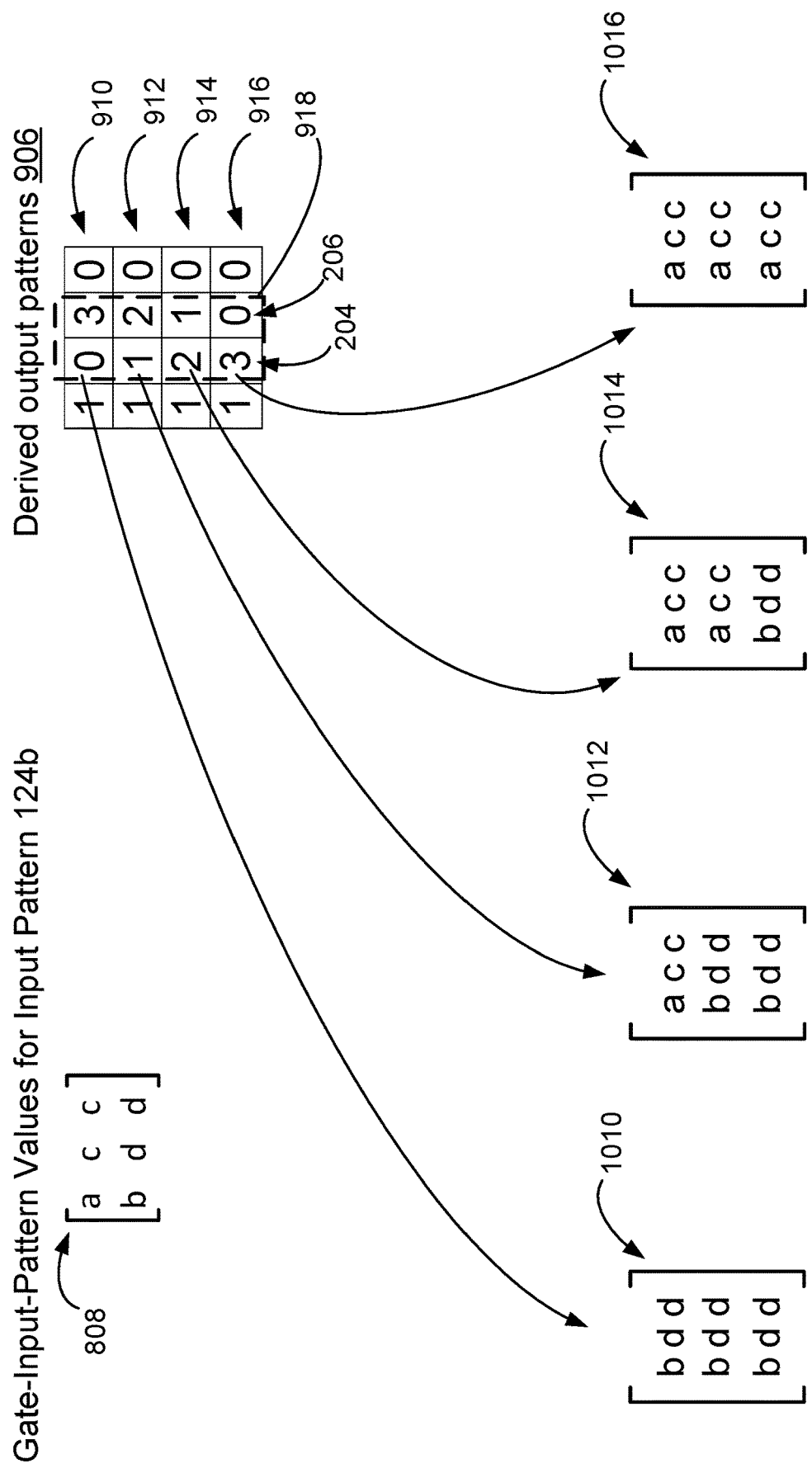
FIG. 10 illustrates determination of a set of gate-output-pattern values, in accordance with some embodiments.

FIGS. 8-10 illustrate using a group of input patterns (determined as described with regard to FIGS. 5-6) to determine an output state that corresponds to a group (e.g., modified group 508) and to a gate (e.g., beamsplitter gate 214).

FIG. 8 illustrates determination of a set of gate-input-pattern values for gate 214 and modified group 508, in accordance with some embodiments. In FIG. 8, device definition 802 corresponds to beamsplitter 214. However, for simplicity of explanation, although the actual device definition of a beamsplitter gate 214 is a numerical definition (e.g., as indicated at 302a or 302b), device definition 802 uses variables a, b, c, and d to represent the numerical values of the beamsplitter gate definition. As shown in box 804 that indicates a portion of diagram 200, beamsplitter 214 operates on the second mode 204 and the third mode 206 of the quantum computing device indicated by diagram 200. Because beamsplitter 214 operates on the second mode 204 and the third mode 206 of the quantum computing device, the second mode 204 and the third mode 206 are active modes for the gate. As discussed with regard to FIG. 6, box 602 illustrates the active elements in the group (e.g., modified group 508)).

Matrix 808 indicates a set of gate-input-pattern values generated for input pattern 124b and the gate defined by 802. To construct the gate-input-pattern values, a column of gate definition 802 that corresponds to a mode operated on by the gate (e.g., second mode 202) is added to matrix 808 for each photon indicated by the number of photons in the active element of the input pattern that corresponds to the mode. As a result, the number of rows in the set of gate-input-pattern values is equal to the number of modes operated on by a gate and the number of columns in the set of gate-input-pattern values is equal to the number of photons in the active elements of the input pattern.

For example, the column of gate definition 802 that corresponds to the second mode 204 includes the values a and b. The element of input pattern 124b that corresponds to the second mode 204 indicates 1 photon. Matrix 808 includes one column that includes the values a and b (corresponding to the one photon of the second mode of input pattern 124b). The column of gate definition 802 that corresponds to the third mode 206 includes the values c and d. The element of input pattern 124b that corresponds to the third mode 206 indicates 2 photons. Matrix 808 includes two columns that include the values c and d (corresponding to the two photons of the third mode of input pattern 124*b*).

Matrix 810 indicates a set of gate-input-pattern values generated for input pattern 124*c* and the gate defined by 802. The element of input pattern 124*c* that corresponds to the second mode 204 indicates 2 photons. Matrix 810 includes two columns that include the values a and b (corresponding to the two photons of the second mode of input pattern 124*b*). The column of gate definition 802 that corresponds to the third mode 206 includes the values c and d. The element of input pattern 124*c* that corresponds to the third mode 206 indicates 1 photon. Matrix 810 includes one column that includes the values c and d (corresponding to the one photon of the third mode of input pattern 124*b*).

Matrix 812 indicates a set of gate-input-pattern values generated for input pattern 124*a* and the gate defined by 802. The element of input pattern 124*a* that corresponds to the second mode 204 indicates 3 photons. Matrix 810 includes three columns that include the values a and b (corresponding to the three photons of the second mode of input pattern 124*b*). The column of gate definition 802 that corresponds to the third mode 206 includes the values c and d. The element of input pattern 124*a* that corresponds to the third mode 206 indicates 0 photons. As a result, matrix 812 includes no columns that includes the values c and d.

FIG. 9 illustrates deriving a set of output patterns from a group of input patterns (e.g., modified group 508), in accordance with some embodiments. A set of output patterns that corresponds to a group of input patterns includes N+1 patterns for a group with N bosons in two active modes. For example, a set of output patterns that corresponds to modified group 508 (which has two active modes, as indicated by box 602, because gate 214, for which modified group 508 was generated, operates on second mode 204 and third mode 206 of the device indicated by diagram 200), includes three (N) bosons in active modes (e.g., 1+2 bosons in the active modes of input pattern 124*b*, 2+1 bosons in the active modes of input pattern 124*c*, and 3+0 bosons in the active modes of input pattern 124*a*). Accordingly, the set of output patterns that corresponds to modified group 508 includes four (N+1) patterns. The added pattern for the active modes is indicated by arrow 904 in the full set of patterns 902 for the active modes that correspond to modified group 508. The passive elements for modified group 508 (as indicated in boxes 604 and 606) are added to the full set of derived output patterns shown at 906. Because the second mode 204 and the third mode 206 are active modes for the gate that corresponds to modified group 508, the second mode 204 and the third mode 206 are also active modes for derived output patterns 906 (as indicated by box 918). Passive modes of the derived output patterns 906 are indicated by boxes 920 and 922.

FIG. 10 illustrates determination of a set of gate-output-pattern values based on the gate-input-pattern values generated for input pattern 124*b* (as indicated by matrix 808) and the derived output patterns 906, in accordance with some embodiments. To construct the set of gate-output-pattern values, for each photon indicated by the number of photons in an active element of the output pattern, a corresponding row of matrix 808 is added to the set.

For example, gate-output-pattern matrix 1010 is constructed from output pattern 910. The element of output pattern 910 that corresponds to the second mode 204 indicates 0 photons, as indicated in box 918. Gate-output-pattern matrix 1010 does not include a row from matrix 808 including the values [a c c] because the second mode 204 in the output pattern 910 has zero photons. The element of output pattern 910 that corresponds to the third mode 206 indicates 3 photons, as indicated in box 918. Gate-output-pattern matrix 1010 includes three rows from matrix 808 that include the values [b d d] because three photons in the output pattern 910 correspond to the third mode 206.

Gate-output-pattern matrix 1012 is constructed from output pattern 912. Gate-output-pattern matrix 1012 includes one row from matrix 808 including the values [a c c] because one photon in the output pattern 912 corresponds to the second mode 204. Gate-output-pattern matrix 1012 includes two rows from matrix 808 that include the values [b d d] because two photons in the output pattern 912 correspond to the third mode 206.

Gate-output-pattern matrix 1014 is constructed from output pattern 914. Gate-output-pattern matrix 1012 includes two rows from matrix 808 including the values [a c c] because two photons in the output pattern 914 correspond to the second mode 204. Gate-output-pattern matrix 1012 includes one row from matrix 808 that includes the values [b d d] because one photon in the output pattern 914 corresponds to the third mode 206.

Gate-output-pattern matrix 1016 is constructed from output pattern 916. Gate-output-pattern matrix 1014 includes three rows from matrix 808 including the values [a c c] because three photons in the output pattern 916 correspond to the second mode 204. Gate-output-pattern matrix 1016 includes no rows from matrix 808 that include the values [b d d] because the third mode 206 of the output pattern 914 has zero photons.

In some embodiments, to determine a representative output value that indicates the contribution of an input pattern (e.g., input pattern 124*b*) to an output pattern (e.g., output pattern 910), an amplitude transfer value (e.g., a permanent of a matrix) is calculated from a gate-output-pattern value. In some embodiments, to determine a modified representative output value, the calculated amplitude transfer value is multiplied by the amplitude of the input pattern (e.g., (−0.250+0.250i) for input pattern 124*b*, as indicated by amplitude 126*b* in FIG. 4). For example, to determine an amplitude of output pattern 910, simulation logic 114 calculates a permanent of the matrix 1010 (with variables b and d replaced with the actual numerical values of the gate). A modified representative output value is determined by multiplying the representative output value by the complex amplitude value (−0.250+0.250i) for input pattern 124*b*. The resulting complex number is added to an output pattern accumulator that tracks the total output values for each output pattern. For example, the resulting complex number is stored as an amplitude 134 that corresponds to an output pattern 132 (e.g., output pattern 910), or the resulting complex number is added to a complex number that has previously been stored in association with output pattern 132 (e.g., output pattern 910). The output pattern and corresponding amplitudes determined for a gate (e.g., beamsplitter 214) are used an as input pattern and corresponding amplitudes for a subsequent gate (e.g., phase shift gate 216).

When every gate in a quantum computing device has been analyzed, the stored amplitude values 134 and output patterns 132 comprise an output state 130. Output state 130 includes output patterns 132 and amplitudes 134 that correspond to each output pattern.

FIGS. 11A-11B illustrate application of groups from a previous gate to a single-mode gate, in accordance with some embodiments. In some embodiments, the simulation logic 114 forgoes determining group(s) of input patterns for a gate when the gate operates on a single mode (such as phase shift gate 216, which operates on second mode 204). In some embodiments, for a gate that operates on a single mode, group(s) determined for a gate that immediately precedes the single mode gate are used for determining amplitudes of output patterns. For example, because beamsplitter gate 214 precedes phase shift gate 216 (as shown in diagram 200 of the quantum computing device), modified groups 508 and 510 (as discussed with regard to FIGS. 5-7) for beamsplitter gate 214 are used to determine the effect of the input state on phase shift gate 216.

In some embodiments, when analyzing a single mode gate using groups generated for a previous gate, for any group from the preceding gate in which elements in the mode operated on by the single mode gate are passive and zero, all patterns of the group are skipped. Forgoing analysis of input patterns applied to gates in the simulation of the quantum computing device reduces the amount of time required to complete a simulation. In some embodiments, when analyzing a single mode gate using groups generated for a previous gate, for any group from the preceding gate in which elements in the mode operated on by the single mode gate are passive and non-zero, all patterns have the gate applied. In some embodiments, when analyzing a single mode gate using groups generated for a previous gate, for any group from the preceding gate in which elements are active, only members of the group with non-zero affected elements are analyzed. Reducing the number of input patterns applied to gates in the simulation of the quantum computing device reduces the amount of time required to complete a simulation. In some embodiments, for a gate that operates on a single mode, the simulation logic 112 forgoes determining gate-input-pattern values and forgoes determining gate-output-pattern-values (e.g., for phase gate 216, the output amplitude 134 that corresponds to an input pattern 124 is determined without calculating a permanent of a matrix (such as matrix 1010) that includes the gate-output-pattern values).

In FIG. 11A, phase shift gate 216 operates on second mode 204 of the quantum computing device indicated by diagram 200, as indicated by box 804 that includes a portion of diagram 200 with phase shift gate 216 following beamsplitter gate 214. For modified group 508, the elements of the second mode 204 (indicated by box 1102) are active for preceding gate 214 (e.g., the beamsplitter 214 operated on the elements in box 1102 because beamsplitter 214 operates on the second mode 204), so the gate is applied (e.g., output amplitudes 134 are determined) for each non-zero element (e.g., phase shift gate 216 is applied to all input patterns in modified group 508). For modified group 510, the elements of the second mode 204 (indicated by box 1104) are active for preceding gate 214, so the gate is applied to each non-zero element (e.g., an output amplitude is determined for input pattern 124d and is not determined for input pattern 124e). (Group 512 is not shown in the examples of FIGS. 11A-11B, although group 512 would also be included in the determination of representative output values for phase shift gate 216.)

In FIG. 11B, an example is provided for a phase shift gate 1108 that operates on a first mode and that is preceded by a beamsplitter 1110 that operates on a second mode and a third mode of a quantum computing device. In the illustrative example, modified group 508, modified group 510, and group 512 (not shown) correspond to beamsplitter 1110. For modified group 508, the elements of the first mode operated on by phase shift gate 1108 (indicated by box 1112) are passive for preceding gate 1110 (e.g., gate 1110 did not operate on the first mode), so the gate is applied (e.g., output amplitudes 134 are determined) for each non-zero element (e.g., phase shift gate 1108 is applied to all input patterns in modified group 508). For modified group 510, the elements of the first mode (indicated by box 1114) are passive for preceding gate 1110 (e.g., gate 1110 did not operate on the first mode). Because all elements in box 1114 are zero, simulation logic 112 forgoes determining an output amplitude for input patterns 124d and 124e.

Figure 12:
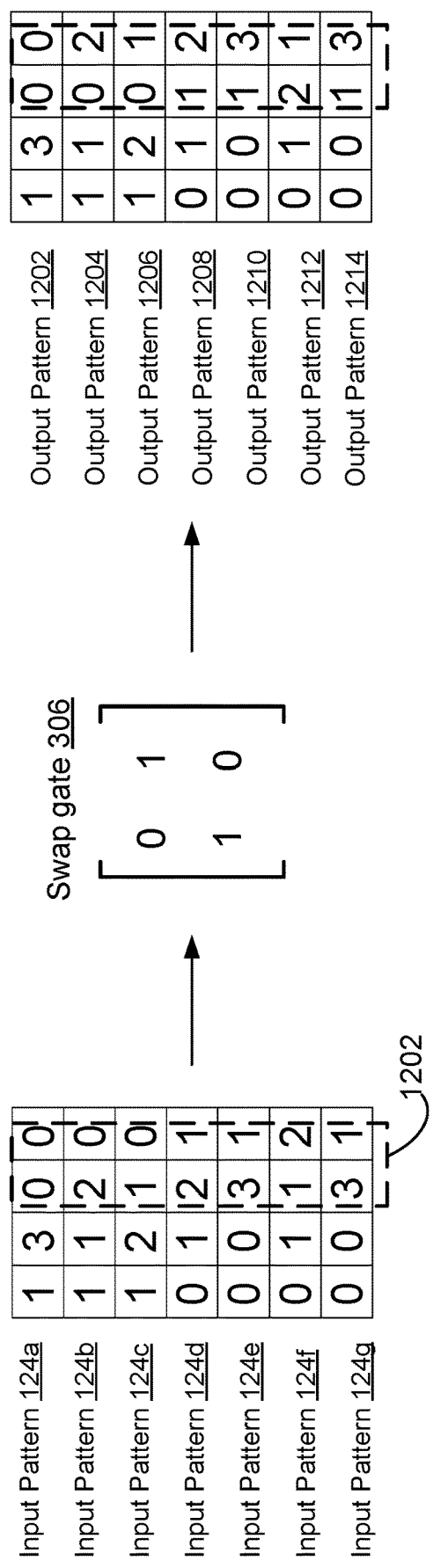
FIG. 12 illustrates an example of application of a common gate to a set of input patterns in an input state, in accordance with some embodiments.
Figure 14A:
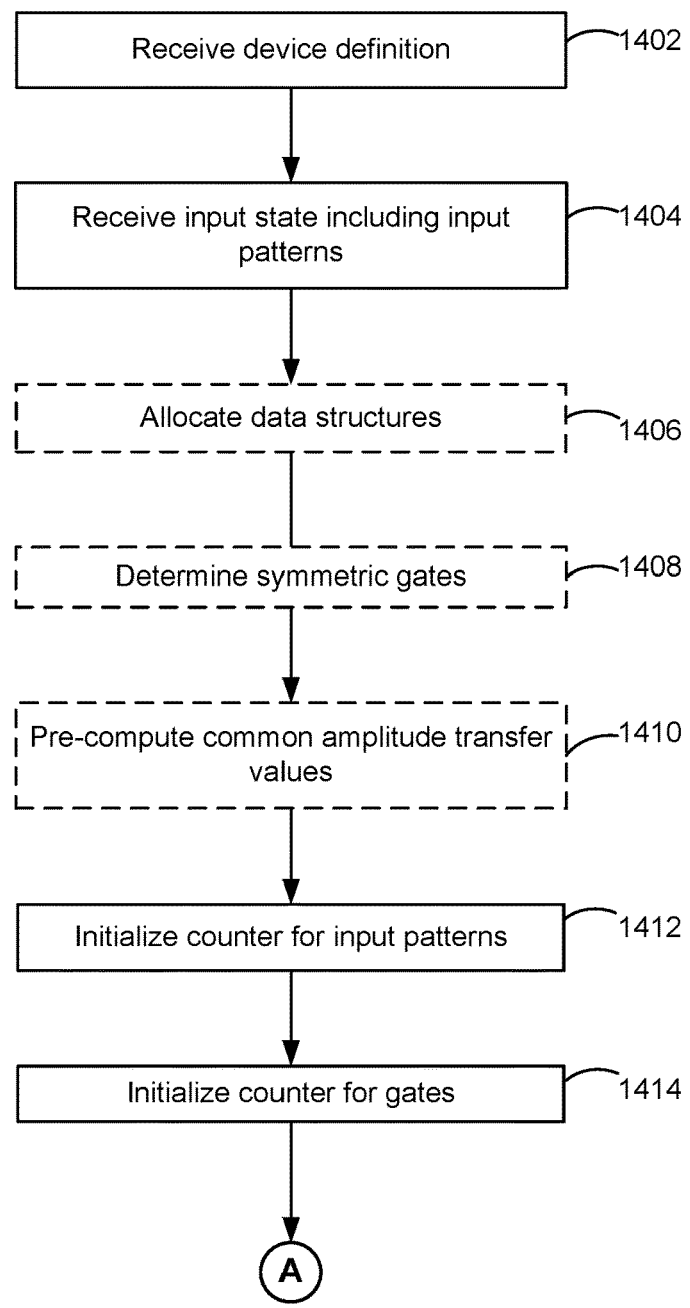
FIGS. 14A-14G provide a flow chart for a method of increasing a rate of simulation for quantum computing devices, in accordance with some embodiments.
Figure 14B:
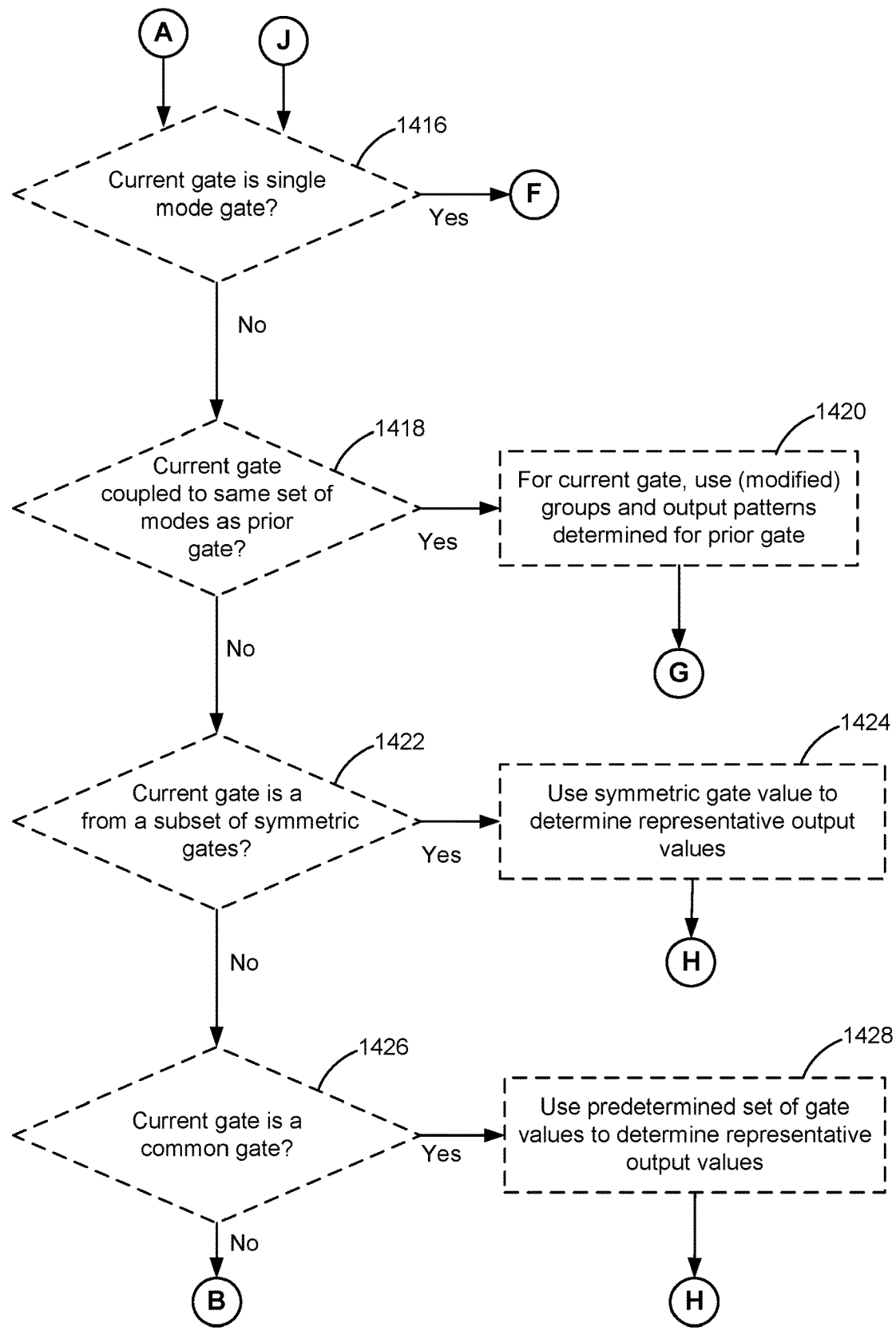
Figure 14C:
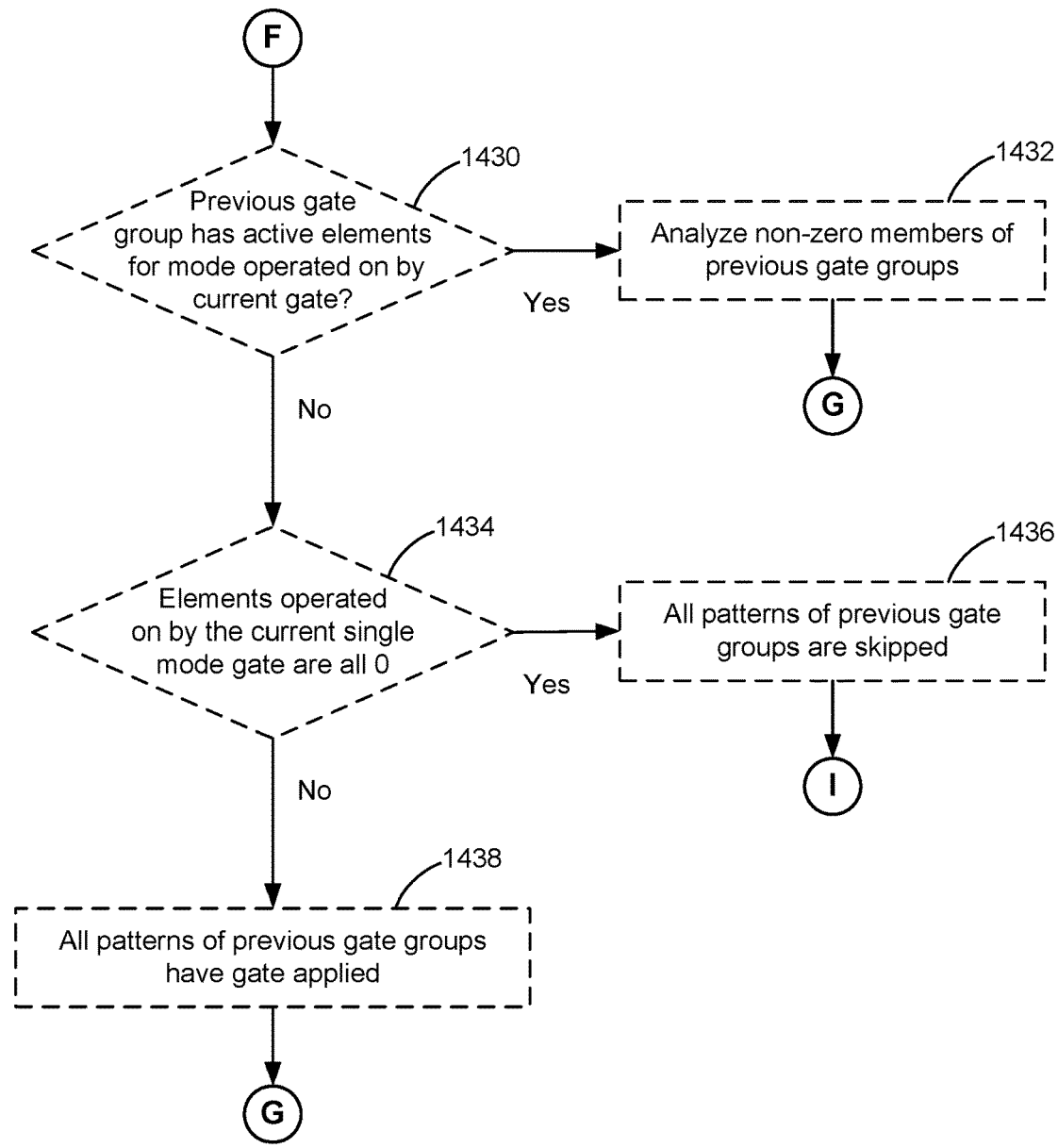
Figure 14D:
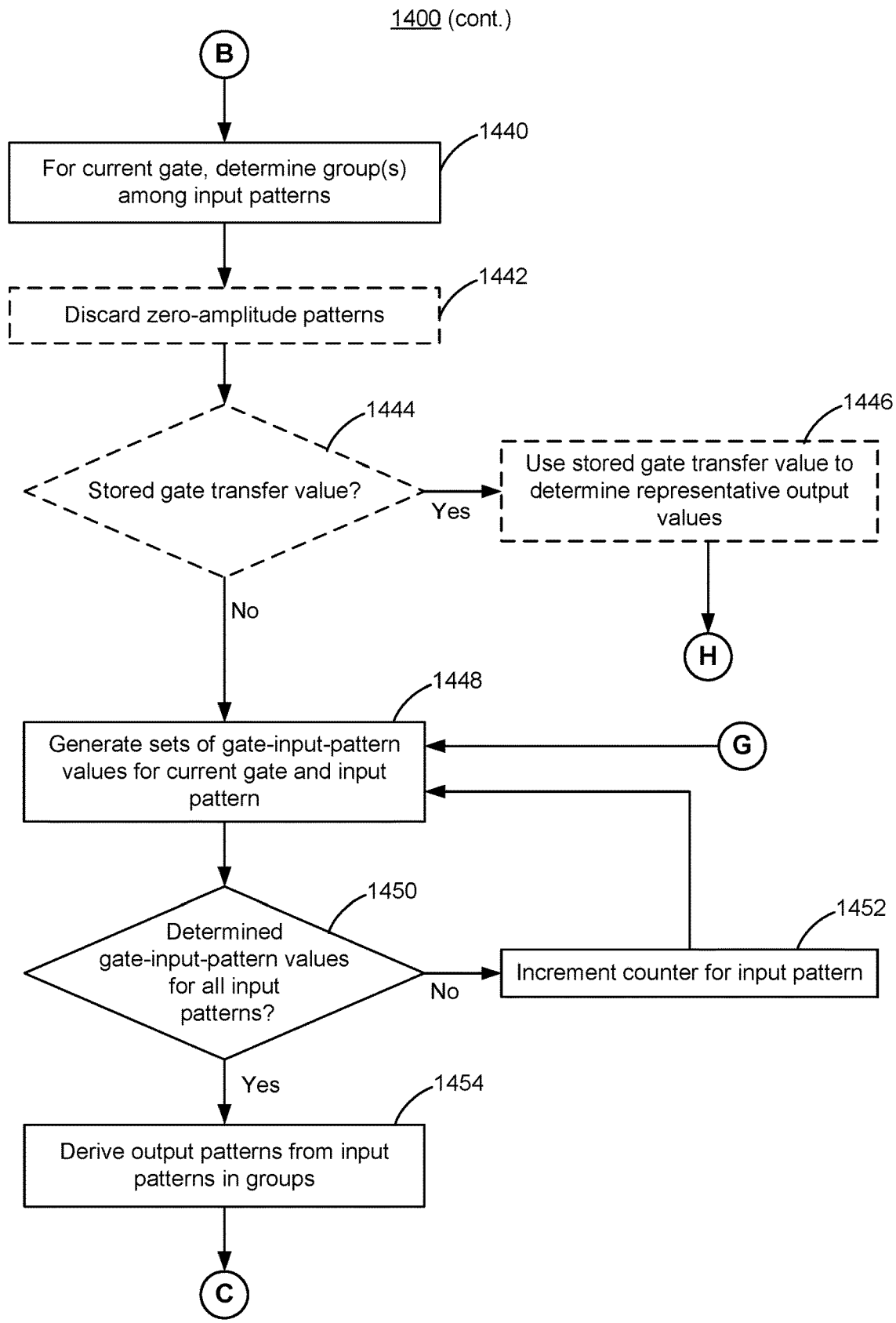
Figure 14E:
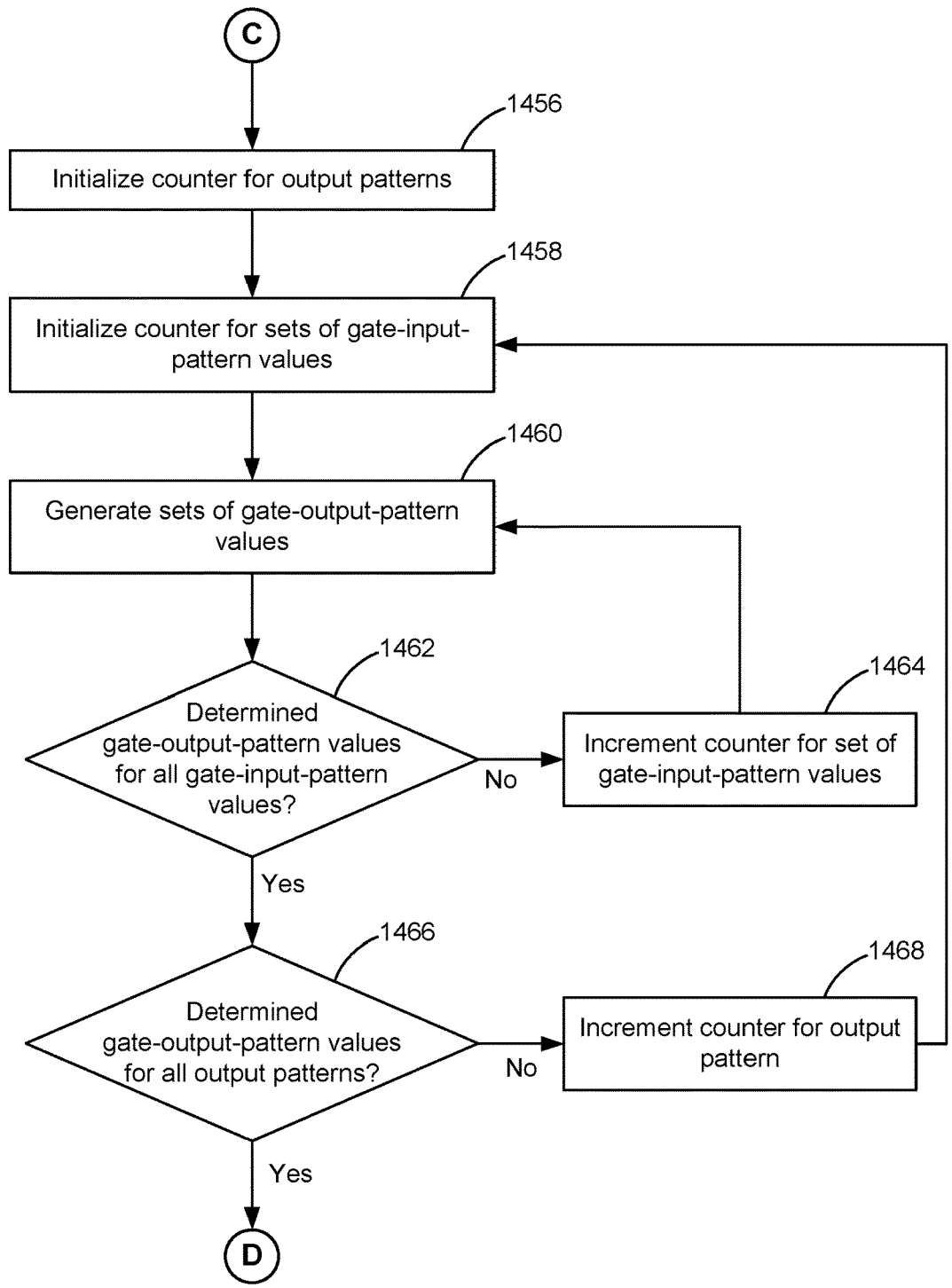
Figure 14F:
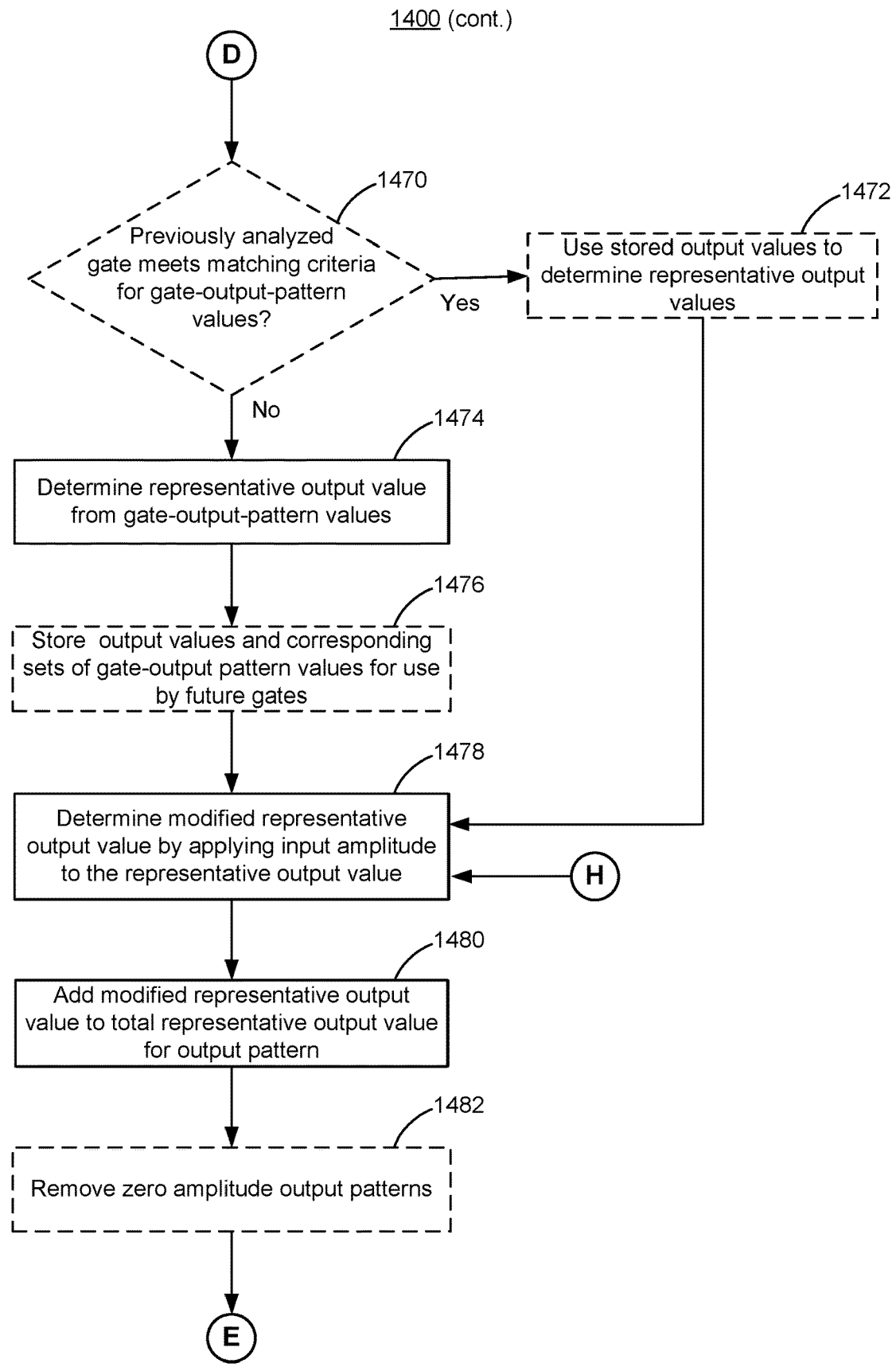
Figure 14G:
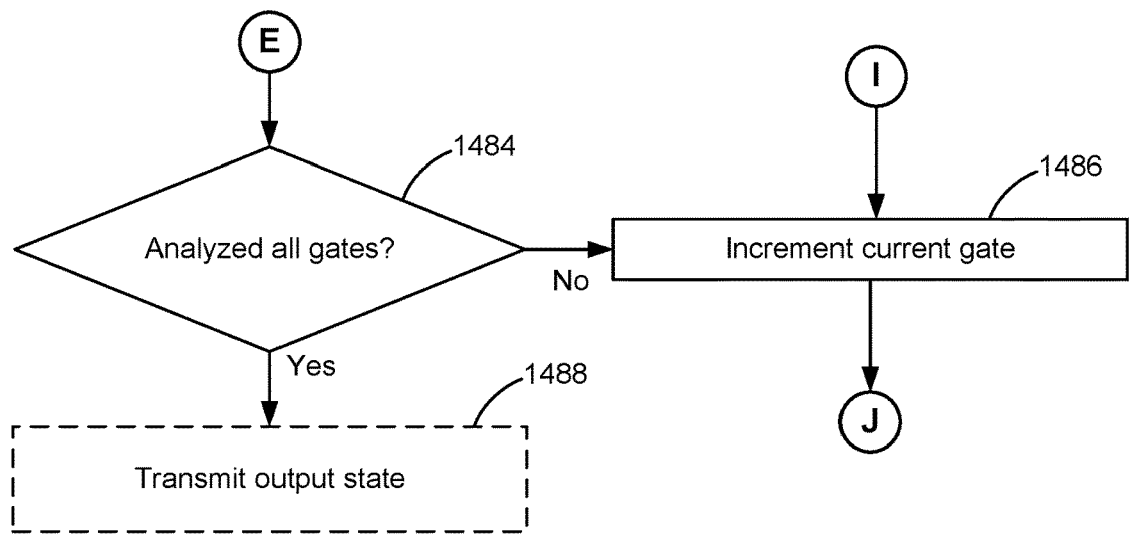
Figure 15C:
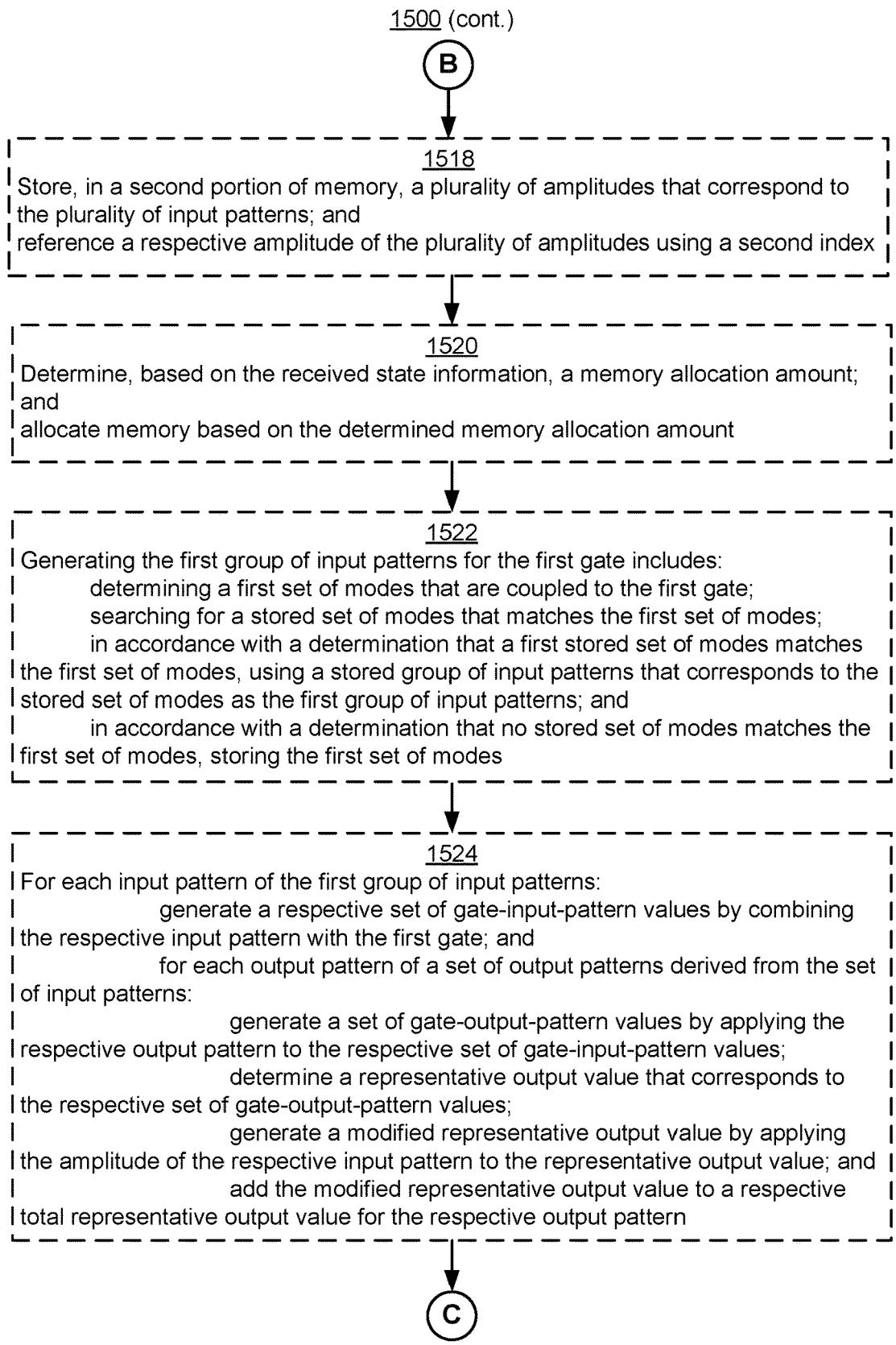
Figure 15D:
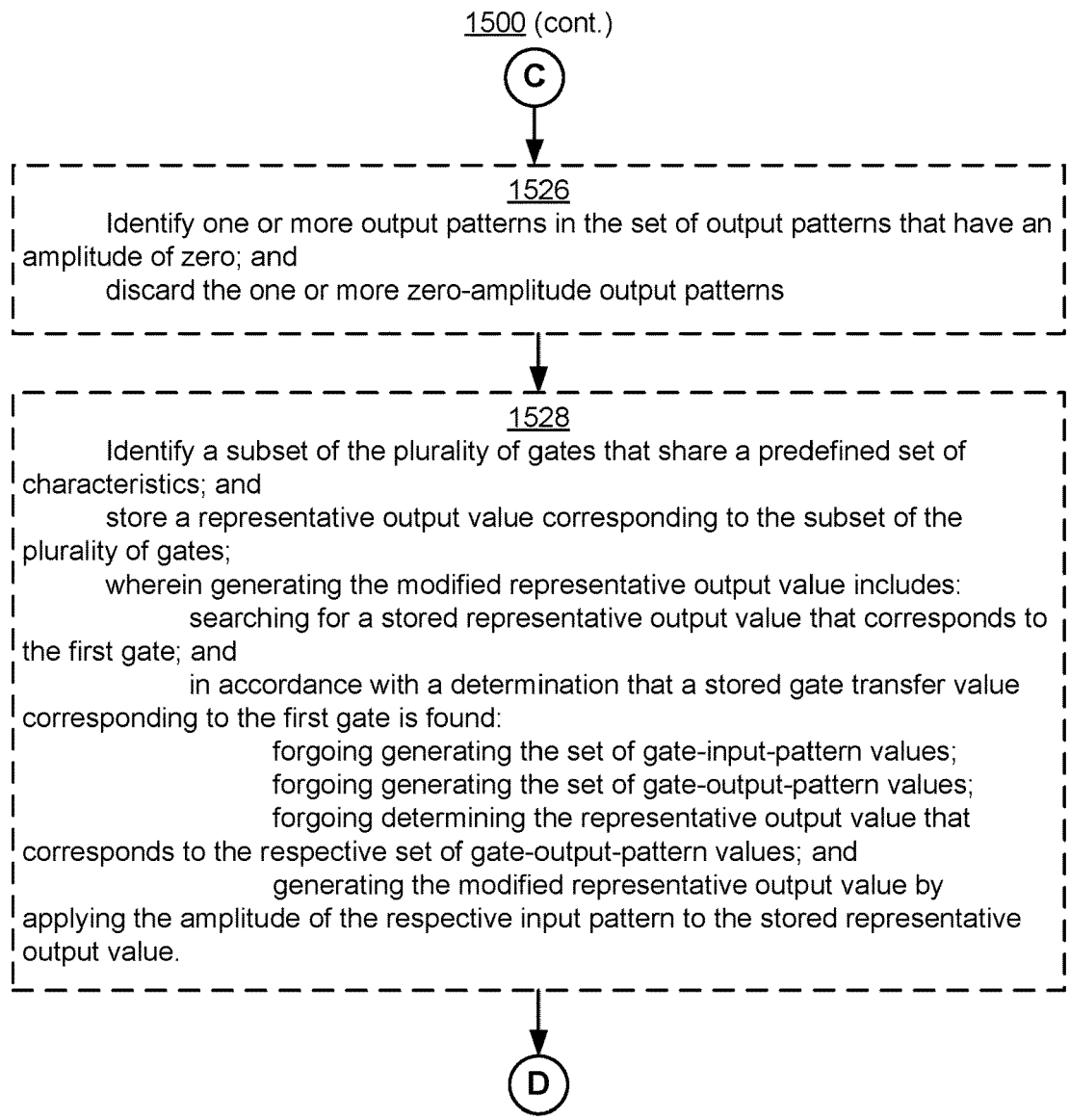
Figure 15E:
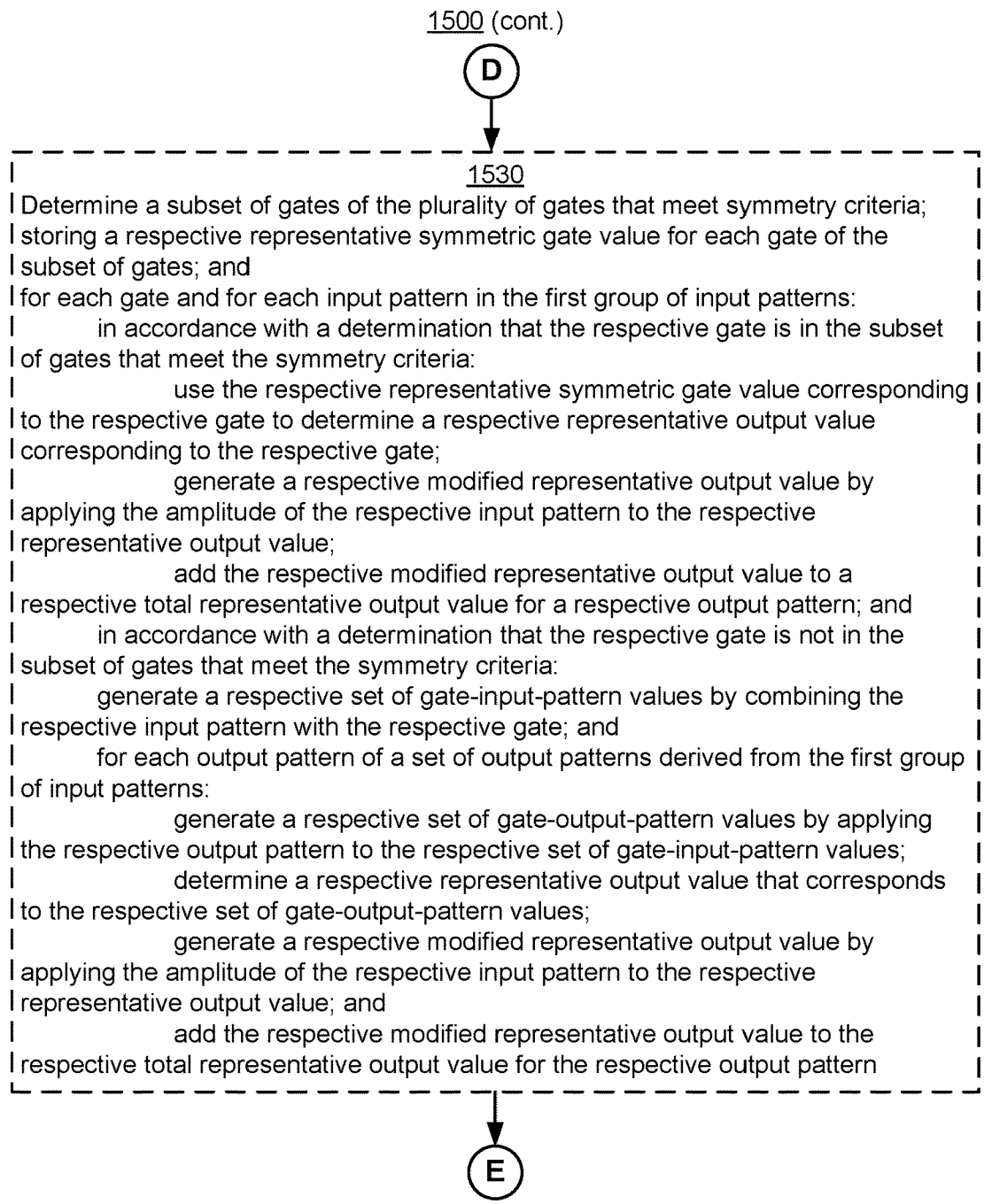

FIG. 12 illustrates an example of application of a common gate to a set of input patterns 124 in an input state, in accordance with some embodiments. In some embodiments, in accordance with a determination that a gate is a common gate (e.g., a gate for which a device definition and/or identifying information has been previously stored by memory 102), simulation logic 112 forgoes determining groups, gate-input-pattern values, and/or gate-output-pattern values for the gate. For example, in accordance with a determination that a gate is swap gate 306 that operates on a third mode and a fourth mode (as indicated by box 1202 surrounding the active elements of input patterns 124a-124g, simulation logic determines a set of output patterns 1202-1214 based on the set of input patterns by swapping the values of the active elements in each input pattern. For example, the active elements of output pattern 1204 are [0 2], which is the reverse of the active elements [2 0] in input pattern 124b. Output patterns 1204, 1206, 1208, 1210, 1212, 1214, are the result of applying the swap operation of gate 306 to input pattern 124a, 124b, 124c, 124d, 124e, 124f, 124g, respectively. The amplitudes of output patterns 1202-1214 are the same as the amplitudes of corresponding input patterns 124a-124g, respectively. For example, the amplitude of output pattern 1208 is equal to amplitude 126d (−0.250+0.150i) of input pattern 124d (as indicated in FIG. 4).

FIGS. 14A-14F provide a flow chart for a method 1400 of increasing a rate of simulation for quantum computing devices, in accordance with some embodiments. The method is performed at computer system 100. For example, instructions for performing the method are stored in the memory 104 and executed by the processor(s) 102 of the computer system 100. In FIG. 14, dotted outlines indicate optional operations The method 1400 includes receiving (1402) a device definition 118 for a quantum computing device (e.g., a quantum computing device as indicated by diagram 200, FIG. 2) The device definition 118 includes a plurality of sets of gate values, wherein a respective set of gate values (e.g., a gate matrix, such as one of the gate definitions illustrated at FIGS. 3A-3E) indicates modification by a respective gate 120 of an input pattern probability.

The device receives (1404) state information (e.g., input state 122, FIG. 4) for the quantum computing device. The state information includes a plurality of input patterns (e.g., input pattern values 124a-124h) and a plurality of amplitudes (e.g., amplitude values 126a-126h).

In some embodiments, the device allocates (1406) memory (e.g., data structures) based on the received device definition and/or the received input state. For example, the device allocates memory based on a determined number and/or size of gates, input patterns, input amplitudes, gate-input-pattern values, gate-output-pattern values, and/or representative output values.

In some embodiments, the device determines (1408) a subset of the plurality of gates 120 that are symmetric gates (e.g., as described with regard to 1422).

In some embodiments, the device determines (1410) amplitude transfer values (e.g., permanents) for common gates (e.g., gates 120 of the device definition 118 that operate on the same modes and/or that have the same definitions).

The device initializes (1412) a counter for the input patterns in the input state 122.

The device initializes (1414) a counter for the gates in the device definition 118.

In some embodiments, the device performs one or more checks (e.g., as indicated at decision diamonds 1416, 1418, 1422, and/or 1426) to determine if various stages of the process for determining representative output values based on the input state 122 and the device definition 118 can be bypassed.

Figure 11:
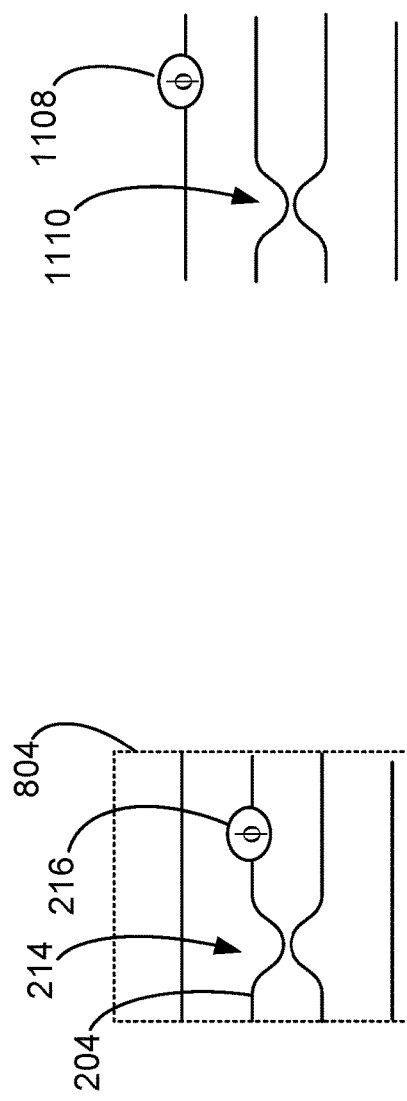
FIGS. 11A-11B illustrate application of groups from a previous gate to a single-mode gate, in accordance with some embodiments.

In some embodiments, the device determines (1416) whether a current gate is a single mode gate (e.g., as described with regard to FIG. 11). In accordance with a determination that the current gate is a single mode gate, the method proceeds to operation 1430, as indicated at F. In accordance with a determination that the current gate is not a single mode gate, the method proceeds to operation 1418.

In some embodiments, the device determines (1418) whether a current gate is coupled to the same set of modes as a previously analyzed gate. For example, in device diagram 200, beamsplitter 214 is coupled to second mode 202 and third mode 204. In some embodiments, if the current gate is beamsplitter 218, the device determines that the current gate is coupled to the same set of modes as a previously analyzed gate, because previously analyzed beamsplitter 214 is also coupled to second mode 202 and third mode 204. In accordance with a determination that the current gate is coupled to the same set of modes as a previously analyzed gate, the method proceeds to operation 1420. In accordance with a determination that the current gate is not coupled to the same set of modes as a previously analyzed gate, the method proceeds to operation 1422.

In some embodiments, in accordance with a determination that the current gate is coupled to the same set of modes as a previously analyzed gate, the device uses (1420) groups determined for a previously analyzed gate (e.g., (modified) groups 508, 510, and 512, determined for analysis of beamsplitter 214, are also used for analysis of beamsplitter 216 when beamsplitter 216 is the current gate). The method proceeds from operation 1420 to operation 1448 (e.g., bypassing generation of groups, as indicated at 1440), as indicated at G.

In some embodiments, the device determines (1422) whether a current gate is from a subset of gates of the plurality of gates that meet symmetry criteria. In some embodiments, a first gate is symmetric with a second gate when the first gate and the second gate operate on a number of modes that is below a threshold number of modes (e.g., the gates of the subset operate on fewer than three modes), when the first gate and the second gate would generate a matrix (e.g., matrix 1010) that includes a set of gate-output-pattern values that has the same amplitude transfer value before and after transformation of the matrix, and/or a when the first gate and the second gate would generate a matrix (e.g., matrix 1010) that includes a set of gate-output-pattern values that has rows and/or columns that can be re-ordered without changing an amplitude transfer value of the matrix. For example, in gate-output-pattern matrix 1010, the values represented by "b" and "d" are repeated such that the second and third columns of matrix 1010 are interchangeable and such that the first, second, and third rows of matrix 1010 are interchangeable. The ability to transform the matrix without changing the permanent allows the avoidance of redundant calculation (e.g., by using a representative output value calculated and stored for a previously analyzed gate when determining a representative output value for a current gate).

Additionally, the permanent of matrices with a large number of identical values may follow patterns which can be used to quickly calculate the permanent without constructing the matrix at all, which lowers the demand on memory 104 and the processor(s) 102. For example, if it is known that a portion of a matrix contains only identical values, the permanent may be calculated using faster algorithms than the algorithms used for a matrix that does not contain only identical values. An illustrative example of the reduction in memory operations and/or accesses realized when calculating permanents of matrices with identical values is presented below. For a 3×3 unitary matrix with values a-k, as indicated at 1302 of FIG. 13, the permanent is calculated as follows:

$$a(ek+hf)+b(dk+gf)+c(dh+ge) \quad (1306).$$

By determining in advance that some of the values are identical, as is the case with the matrix 1304 of FIG. 13, the permanent calculation is reduced to $$a(ee+ee)+a(ae+ae)+a(ae+ae),$$

which reduces to $$ae(2e+4a) \quad (1308),$$

which is 5 math operations and 2 RAM accesses, instead of the original 14 math operations and 9 RAM accesses.

In accordance with a determination that the current gate is from a subset of gates of the plurality of gates that meet symmetry criteria, the method proceeds to operation 1424. In accordance with a determination that the current gate is not coupled to the same set of modes as a previously analyzed gate, the method proceeds to operation 1426.

In some embodiments, in accordance with a determination that the current gate is from a subset of gates of the plurality of gates that meet symmetry criteria, the device uses (1424) representative output values (e.g., amplitude transfer values, such as a permanent of a matrix) for a previously analyzed gate to determine representative output values for the current gate. The method proceeds from operation 1424 to operation 1476, as indicated at H (e.g., bypassing generating groups of input patterns, generation of gate-input-pattern groups, and generation of gate-output-pattern groups).

In some embodiments, the device determines (1426) whether a current gate is a common gate for which a predetermined set of gate values can be used to determine representative output values for the current gate. In accordance with a determination that the current gate is a common gate, the method proceeds to operation 1428. In accordance with a determination that the current gate is not a common gate, the method proceeds to operation 1440, as indicated at B.

In some embodiments, in accordance with a determination that the current gate is a common gate, the device uses (1428) a predetermined set of gate values (e.g., as described with regard to FIG. 12) to determine representative output values. The method proceeds from operation 1428 to operation 1478, as indicated at H (e.g., bypassing generating groups of input patterns, generation of gate-input-pattern groups, and generation of gate-output-pattern groups).

In some embodiments, in accordance with a determination that the current gate (e.g., phase shift gate 216) is a single mode gate, the device determines (1430), for each input pattern group (e.g., (modified) group 508, 510, and 512) determined for the previous gate (e.g., beamsplitter gate 214), whether the group has active elements for a mode operated on by a current gate. In accordance with a determination that the group has active elements for a mode operated on by a current gate (e.g., as indicated at 1102 and 1104 for modified groups 508 and 510, respectively), the method proceeds to operation 1432. In accordance with a determination that the group does not have active elements for a mode operated on by a current gate (e.g., as indicated at 1112 and 1114 for modified groups 508 and 510, respectively), the method proceeds to operation 1434.

In some embodiments, in accordance with a determination that a group has active elements for a mode operated on by a current gate, representative output values are determined (1432) using non-zero members of the groups for the previous gate. The method proceeds from 1432 to 1448 as indicated at G (e.g., bypassing determination of groups from an input state).

In some embodiments, in accordance with a determination that a group that does not have active elements for a mode operated on by a current gate, the device determines (1434), for each input pattern group (e.g., (modified) group 508, 510, and 512) determined for the previous gate (e.g., beamsplitter gate 214), whether the pattern values operated on by the current single mode gate (e.g., phase shift gate 216) are all 0 (e.g., as indicated at 1114 of FIG. 11B for phase gate 1108 following beamsplitter 1110). In accordance with a determination that the pattern values operated on by the current single mode gate are all 0, the method proceeds to operation 1436. In accordance with a determination that the pattern values operated on by the current single mode gate include nonzero values (e.g., as indicated at 1112 for phase gate 1108 following beamsplitter 1110), the method proceeds to operation 1438.

In some embodiments, in accordance with a determination that the pattern values operated on by the current single mode gate are all 0, all patterns of the previous gate groups are skipped (1436) (e.g., the output patterns for the current gate are the same as the input patterns for the current gate the amplitudes of the output patterns are equivalent to the amplitudes of the input patterns). The method proceeds from operation 1436 to operation 1486, as indicated at I.

In some embodiments, in accordance with a determination that the pattern values operated on by the current single mode gate include nonzero values, the current single mode gate is applied (1438) to all patterns of the previous gate groups. The method proceeds from operation 1438 to operation 1448, as indicated at G.

For a current gate, the device determines (1440) groups for a set of input patterns (e.g., as described with regard to FIG. 5).

In some embodiments, the device discards (1442) patterns of the determined groups that have zero amplitude (e.g., as described with regard to input pattern 124h of FIG. 7). In some embodiments, the device discard patterns of the determined groups that have an amplitude within a predefined range of zero.

In some embodiments, the device determines (1444) whether an amplitude transfer value (e.g., permanent) has been stored for the current gate (e.g. as described with regard to operation 1466). In accordance with a determination that an amplitude transfer value has been previously stored for the current gate, the method proceeds to operation 1446. In accordance with a determination that an amplitude transfer value has been not been stored for the current gate, the method proceeds to operation 1448.

In some embodiments, in accordance with a determination that an amplitude transfer value has been previously stored for the current gate, the device uses (1446) the stored amplitude transfer value to determine representative output values for the gate. The method proceeds from operation 1446 to operation 1478, as indicated at H.

The device determines (1448) a set of gate-input-pattern values (e.g., as indicated at matrix 808) for the current gate and for the current input pattern (e.g., as described with regard to FIG. 8).

The device determines (1450) whether gate-input-pattern values have been generated for all input patterns in all groups. In accordance with a determination that gate-input-pattern values have not been generated for all input patterns in all groups, the method proceeds to operation 1452. In accordance with a determination that gate-input-pattern values have been generated for all input patterns in all groups, the method proceeds to operation 1454.

In accordance with a determination that gate-input-pattern values have not been generated for all input patterns in all groups, the device increments (1452) the input pattern counter.

In accordance with a determination that gate-input-pattern values have been generated for all input patterns in all groups, the device derives (1454) output patterns from the input patterns in each group (e.g., as described with regard to FIG. 9). The method proceeds from operation 1454 to operation 1456, as indicated at C.

The device initializes (1456) a counter equal to the number of output patterns derived for all of the groups for the current gate (e.g., the output patterns derived in operation 1454).

The device initializes (1458) a counter equal the number of sets of gate-input-pattern values generated for the current gate (e.g., as described with regard to 1448).

The device generates (1460) sets of gate-output-pattern values that correspond to the current output pattern, the current gate-input-pattern value, and the current gate (e.g., as described with regard to FIG. 10).

The device determines (1462) whether sets of gate-output-pattern values have been generated for all of the generated sets of gate-input-pattern values for the current gate. In accordance with a determination that sets of gate-output-pattern values have not been generated for all sets of gate-input-pattern values, the method proceeds to operation 1464. In accordance with a determination that sets of gate-output-pattern values have been generated for all of the sets of gate-input-pattern values, the method proceeds to operation 1466.

In accordance with a determination that gate-output-pattern values have not been generated for all sets of gate-input-pattern values, the device increments (1464) the gate-input-pattern set counter.

In accordance with a determination that gate-output-pattern values have been generated for all sets of gate-input-pattern values, the device determines (1466) whether sets of gate-output-pattern values have been generated for all of the output patterns for all of the groups for the current gate. In accordance with a determination that sets of gate-output-pattern values have not been generated for all of the output patterns, the method proceeds to operation 1468. In accordance with a determination that sets of gate-output-pattern values have been generated for all of the output patterns, the method proceeds to operation 1470, as indicated at D.

In accordance with a determination that gate-output-pattern values have not been generated for all of the output patterns, the device increments (1468) the output pattern counter and re-initializes (1458) the counter for the sets of gate-input-pattern values.

In some embodiments, the device determines (1470) whether a set of values (e.g., generated at operation 1476) stored for a previously analyzed gate meets matching criteria (e.g., as described further below with regard to 1532) for at least one set of gate-output-pattern values (e.g., as generated at operation 1460) for the current gate. In accordance with a determination that a set of values stored for a previously analyzed gate meets the matching criteria for at least one set of gate-output-pattern values, the method proceeds to operation 1472. In accordance with a determination that no set of values stored for a previously analyzed gate meets the matching criteria for at least one set of gate-output-pattern values, the method proceeds to operation 1474.

In accordance with a determination that a set of values stored for a previously analyzed gate meets the matching criteria for at least one set of gate-output-pattern values, the device uses (1472) the stored set of values to determine representative output values for the at least one set of gate-output-pattern values.

The device determines (1474) a representative output value for each set of gate-output-pattern values (e.g., by calculating an amplitude transfer function, such as a permanent, of the set of gate-output-pattern values).

In some embodiments, the device stores (1476) the sets of gate-output-values and corresponding determined representative output values for use by future gates (e.g., as discussed at 1470).

The device determines (1478) a modified representative output value for a set of gate-output-pattern values by applying an input amplitude 126 that corresponds to a gate-input-pattern from which the set of gate-output-pattern values was determined to the representative output value that corresponds to the set of gate-output-pattern values.

The device adds (1480) to determined modified representative output value to a total representative output value for the corresponding output pattern.

In some embodiments, the device removes (1482) (from the set of output patterns) any output patterns that have an amplitude of zero. In some embodiments, the device removes (from the set of output patterns) any output patterns that have an amplitude within a predetermined range of zero. The method proceeds from 1482 to 1484, as indicated at E.

The device determines (1484) whether all of the gates 120 indicated in the device definition 118 have been analyzed. In accordance with a determination that the gates have not all been analyzed, the method proceeds to operation 1486. In accordance with a determination that all of the gates have been analyzed, the method proceeds to operation 1488.

In accordance with a determination that that the gates have not all been analyzed, the device increments (1486) the current gate counter. The current set of output patterns and modified representative output values are the set of input values for the subsequent gate.

In accordance with a determination that that the gates have all been analyzed, the device displays, provides a means of accessing, and/or transmits (1488) the output state determined from the total representative output value for each output pattern. In some embodiments, the device displays, by a display coupled to and/or integrated with the device, the output state. In some embodiments, the device transmits, to a remote device (e.g., remote device 136) the output state. In some embodiments, the output state is stored by the device for inspection and/or retrieval by a remote device (e.g., remote device 136). In some embodiments, the total representative output values are normalized so that the probability values for the set of output values sum to 1.

In some embodiments, 1474, 1476, 1480, and/or 1482 are performed between operations 1460 and 1462 (e.g., prior to the iterations performed at 1464 and 1468).

It should be understood that the particular order in which the operations in FIGS. 14A-14F have been described is merely an example and is not intended to indicate that the described order is the only order in which the operations could be performed. One of ordinary skill in the art would recognize various ways to reorder the operations described herein. Additionally, it should be noted that details of other processes described herein with respect to other methods described herein (e.g., methods 1500 and 1600) are also applicable in an analogous manner to method 1400 described above with respect to FIGS. 14A-14F.

FIGS. 15A-15F provide a flow chart for a method 1500 of increasing a rate of simulation for quantum computing devices, in accordance with some embodiments. The method is performed at computer system 100. For example, instructions for performing the method are stored in the memory 104 and executed by the processor(s) 102 of the computer system 100. In FIG. 15, dotted outlines indicate optional operations.

The method 1500 includes receiving (1502) a device definition for a quantum computing device (e.g., a quantum computing device as indicated by diagram 200, FIG. 2). The quantum computing device includes a plurality of gates (e.g., including beamsplitter gate 214 and phase change gate 216) and a plurality of modes (e.g. first mode 202, second mode 204, third mode 206, and fourth mode 208). Each gate of the plurality of gates is coupled to a respective set of one or more of the plurality of modes. The device definition includes a plurality of sets of gate values, wherein a respective set of gate values (e.g., a gate matrix, such as one of the gate definitions illustrated at FIGS. 3A-3E) indicates modification by a respective gate of an input pattern probability.

The device receives (1504) state information (e.g., input state 122, FIG. 4) for the quantum computing device. The state information includes a plurality of input patterns (e.g., input pattern values 124a-124h). Each of the input patterns includes a respective plurality of input pattern values (e.g., input pattern values 402-408). Each input pattern value of the plurality of input pattern values indicates a number of input bosons (e.g., photons) that correspond to a respective mode (e.g., waveguide) of the plurality of modes. For example, as shown in FIG. 4, input pattern value 404 indicates that three bosons correspond to second mode 204 of the device indicated by diagram 200. In some embodiments, an input pattern is a one-dimensional input matrix indicating a number of photons input at each waveguide of a device. The state information includes a plurality of amplitudes (e.g., amplitude values 126a-126h). Each respective amplitude of the plurality of amplitudes indicates a probability associated with a respective input pattern of the plurality of input patterns. For example, amplitude is a complex number and the squared magnitude of the amplitude indicates a probability that corresponds to the input pattern.

The device generates (1506) (e.g., for each respective gate of the plurality of gates) a first group of input patterns for a first gate, wherein the first group of input patterns includes a subset (e.g., all or less than all) of the plurality of input patterns that meet grouping criteria.

In some embodiments (1508), a first criterion of the grouping criteria is satisfied in accordance with a determination that passive elements of the input patterns are identical, wherein passive elements for the first gate are input pattern values that correspond to respective modes that are not coupled to the first gate (e.g., the elements of input patterns 124a-124h indicated in boxes 504 and 506 of FIG. 5 are coupled to the first mode 202 and the fourth mode 208, which are not operated on by beamsplitter gate 216). A second criterion of the grouping criteria is satisfied in accordance with a determination that sums of active elements of the input patterns are equal, wherein active elements for the first gate are input pattern values that correspond to respective modes that are coupled to the first gate (e.g., the elements of input patterns 124a-124h indicated in box 502 of FIG. 5 are coupled to the second mode 204 and the third mode 206, which are operated on by beamsplitter gate 216). FIG. 5 illustrates groups 508 and group 510 that meet the first criterion and the second criterion of the grouping criteria.

In some embodiments, generating the first group of input patterns for the first gate includes ordering (1510) the input patterns in the first group of input patterns according to the active elements corresponding to a first mode of the first gate. For example, FIG. 6 illustrates modifying group 508 to generate modified group 508 in which the active elements of input patterns 124a, 124b, and 124c (as shown in box 602) are ordered by the input pattern values that correspond to the second mode 202. In some embodiments, the input patterns are ordered by numerical value of elements that correspond to the first mode, then by numerical value of elements that correspond a second mode, then by one or more other modes (up to the total number of modes minus one).

In some embodiments, the first gate is coupled (1512) to a first set of one or more modes of the plurality of modes (e.g., beamsplitter gate 214 is coupled to second mode 204 and third mode 206), and generating the first group of input patterns comprises: in accordance with a determination that a second gate is a single mode gate that is coupled to a single mode from the plurality of modes (e.g., phase shift gate 216 is coupled to the second mode 204, and, in an alternative example, phase shift gate 1108 is coupled to the first mode 202), the device (e.g., forgoes generation of a second group of input patterns for the second gate, and) determines a set of elements of the first group of input patterns that correspond to the first mode. In some embodiments, in accordance with a determination that each element in the set of elements is passive and zero, the device forgoes determining a representative output value that corresponds to the second gate (see, e.g., box 1114 of FIG. 11B, where the single mode gate is phase shift gate 1108). In some embodiments, in accordance with a determination that each element in the set of elements is passive and non-zero, the device determines a representative output value using a respective input pattern of the plurality of input pattern values (see, e.g., box 1112 of FIG. 11B, where the single mode gate is phase shift gate 1108). In some embodiments, in accordance with a determination that each element of the set of elements is active, the device determines a representative output value using each non-zero element of the set of elements (see, e.g., boxes 1102 and 1104 of FIG. 11A, where the single mode gate is phase shift gate 216).

In some embodiments, the device detects (1514) N identical input patterns of the plurality of input patterns (e.g., identical input patterns 124e and 124g in group 510, as indicated in FIG. 7), wherein N is an integer greater than one. In some embodiments, the device removes, from the plurality of input patterns, N-1 of the N identical input patterns such that a single input pattern of the N identical input patterns remains in the plurality of input patterns (e.g., in modified group 510, input pattern 124g has been removed such that 124e remains). In some embodiments, the device sets an amplitude of the single remaining input pattern to a sum of amplitudes of the N identical input patterns (for example, in modified group 210, the amplitude of remoted input pattern 124a has been added to the amplitude of remaining input pattern 124e). In some embodiments, removing N-1 identical input patterns from the group of input patterns reduces the simulation time by eliminating input patterns (e.g., prior to iterating through the input patterns) for generating gate-input-pattern values, generating gate-output-pattern values, determining a representative output value, and determining a total representative output value (e.g., as described below with regard to operation 1524).

In some embodiments, the device stores (1516), in a first portion of memory (e.g., as a packed two-dimensional array), the plurality of input pattern values (e.g., 124a-124h) that correspond to the input state (e.g., input state 122). For example, a first dimension of the two-dimensional array has a size that corresponds to a number of modes in a quantum logic device and a second dimension of the two-dimensional array has a size that corresponds to number of input patterns in an input state. In some embodiments, the device references a respective input pattern of the input state using a first index. In some embodiments, storing the plurality of input pattern values occurs after and/or in response to receiving the state information. In some embodiments, packing input pattern values (e.g., sequentially) in memory allows the input patterns (e.g., input patterns in pattern groups) to be referred to by index. Enabling reference by index to input patterns reduces memory consumption and reduces the time required to access input patterns. Additionally, packing input pattern values (e.g., sequentially) in memory allows pre-allocation of buffers for input patterns (e.g., prior to storage of the input patterns), which reduces data storage overhead and uncertainty (e.g., in comparison with systems that rely on dynamic memory allocation).

In some embodiments, the device stores (1518), in a second portion of memory, a plurality of amplitudes (e.g., amplitudes 126a-126h) that correspond to the plurality of input patterns (e.g., input patterns 124a-124h). For example, the plurality of amplitudes are stored as a packed one-dimensional array of complex numbers, wherein a respective complex number includes a first floating-point scalar that corresponds to a real portion of the complex number and a second floating-point scalar that corresponds to an imaginary portion of the complex number. In some embodiments, the device references a respective amplitude of the plurality of amplitudes using a second index. In some embodiments, packing amplitudes (e.g., sequentially) in memory allows the amplitudes to be referred to by index. Enabling reference by index to amplitudes reduces memory consumption and reduces the time required to access amplitudes. Additionally, packing amplitudes values (e.g., sequentially) in memory allows pre-allocation of buffers for the amplitudes (e.g., prior to storage of the amplitudes), which reduces data storage overhead and uncertainty (e.g., in comparison with systems that rely on dynamic memory allocation).

In some embodiments, the device determines (1520), based on the received state information (e.g., based on a number of bosons indicated by the state information, a number of input patterns indicated by the state information, and/or a number of modes indicated by the device definition), a memory allocation amount and the device allocates memory based on the determined memory allocation amount. Pre-allocating storage reduces data storage overhead and uncertainty (e.g., in comparison with systems that rely on dynamic memory allocation).

In some embodiments, generating the first group of input patterns for the first gate includes (1522): determining a first set of (one or more) modes that are coupled to the first gate and searching for a stored set of modes (e.g., stored when input pattern groups were generated for a gate from a previous iteration) that matches the first set of modes. In accordance with a determination that a first stored set of modes matches the first set of modes, the device uses a stored group of input patterns (for the gate from the previous iteration) that corresponds to the stored set of modes as the first group of input patterns. In accordance with a determination that no stored set of modes matches the first set of modes, the device stores the first set of modes (and, in some embodiments, the device generates the first group as described with regard to operation 1506). For example, the first set of modes are stored as a set of modes that will be included in the search during a subsequent iteration. In some embodiments, if a current gate operates on the same modes as the previous gate, the same groups determined for the previous gate are used for the current gate.

In some embodiments, if a current gate operates on different modes from a gate processed in a previous iteration, group members stored for the gate processed in the previous iteration are excluded from a search for input patterns that will be included in a group for the current gate. For example, none of the group members from the gate processed in the previous iteration can be in the same group for the gate processed in the current iteration, as the passive mode values of the input patterns of the groups for the gate processed in the previous iteration are not identical (since they used to be the active modes).

In some embodiments, for each input pattern of the first group of input patterns, the device generates (1524) a respective set of gate-input-pattern values (e.g., a set of gate-input-pattern values is a gate-input-pattern matrix, such as matrix 808 indicated in FIG. 8) by combining the respective input pattern with the first gate. In some embodiments, combining the respective input pattern with the first gate includes, for each mode in each input pattern of each group, for the number of photons listed for that mode in that pattern, inserting the column from the gate matrix corresponding to the mode index of the input pattern (e.g., as described with regard to FIG. 8). In some embodiments, for each output pattern of a set of output patterns derived from the set of input patterns (e.g., as described with regard to FIG. 9), the device generates a set of gate-output-pattern values (e.g., a set of gate-output-pattern values is a matrix, such as matrix 1010) by applying the respective output pattern to the respective set of gate-input-pattern values (e.g., as described with regard to FIG. 10.) In some embodiments, the device determines a representative output value (e.g., an amplitude transfer value) that corresponds to the respective set of gate-output-pattern values. In some embodiments, the device generates a modified representative output value by applying the amplitude of the respective input pattern to the representative output value. In some embodiments, the device adds the modified representative output value to a respective total representative output value for the respective output pattern.

In some embodiments, the device identifies (1526) one or more output patterns in the set of output patterns that have an amplitude of zero, and, (e.g., prior to adding the modified representative output value to a respective total representative output value for the respective output pattern), the device discards the one or more zero-amplitude output patterns. In this way, space in memory is not consumed by output patterns with low or zero amplitude.

In some embodiments, the device identifies (1528) (e.g., after receiving the device definition) a subset of the plurality of gates that share a predefined set of characteristics (e.g., gates that have matching device definitions and that operate on the same modes) and the device stores a representative output value corresponding to the subset of the plurality of gates. In some embodiments, generating the modified representative output value includes searching for a stored representative output value that corresponds to the first gate. In accordance with a determination that a stored gate transfer value corresponding to the first gate is found, the device forgoes generating the set of gate-input-pattern values; forgoes generating the set of gate-output-pattern values; forgoes determining the representative output value that corresponds to the respective set of gate-output-pattern values; and generates the modified representative output value by applying the amplitude of the respective input pattern to the stored representative output value (e.g., as described with regard to 1444-1446 of FIG. 14B).

For example, device 200 includes multiple gates of the same type (e.g., a first beamsplitter gate 214 has a device definition 302a and a second beamsplitter gate 218 also has device definition 302a). In the example, the simulation logic 112 applies a first gate (e.g., a first beamsplitter) to a pattern group that operates on a first set of modes with a first number of bosons in a first mode and a second number of bosons in a second mode (e.g., a pattern group with 4 photons in a first mode operated on by the beamsplitter and 2 photons in a second mode operated on by the beamsplitter). The simulation logic generates gate-input-pattern groups and gate-output-pattern groups to determine a representative output value and caches the determined representative output value. In accordance with a determination that a second gate (e.g., a second beamsplitter) operates on the same first set of modes that were operated on by the first gate, with the first number of bosons in the first mode and the second number of bosons in the second mode (e.g., a pattern group with 4 photons in a first mode operated on by the beamsplitter and 2 photons in a second mode), the simulation logic forgoes generating gate-input-pattern groups and/or gate-output-pattern groups for the second gate. To determine a representative output value for the second gate, the simulation logic 112 retrieves the cached determined representative output value for the first gate.

In some embodiments, the device determines (1530) a subset of gates of the plurality of gates that meet symmetry criteria (e.g., as described with regard to operation 1408). For example, the symmetry criteria include a criterion that is satisfied in accordance with a determination that the gates of the subset operate on a number of modes that is below a threshold number of modes (e.g., the gates of the subset operate on fewer than three modes), a criterion that is satisfied in accordance with a determination that the gates of the subset generate a matrix (e.g., matrix 1010) that includes a set of gate-output-pattern values that has the same amplitude transfer value before and after transformation of the matrix, and/or a criterion that is satisfied in accordance with a determination that the gates of the subset generate a matrix (e.g., matrix 1010) that includes a set of gate-output-pattern values that has rows and/or columns that can be re-ordered without changing an amplitude transfer value of the matrix. Gates that operate on a small number of modes yield sets of gate-output-pattern values that contain repeated information in the rows and columns of the matrix. In some embodiments, the device stores a respective representative symmetric gate value for each gate of the subset of gates, and, for each gate and for each input pattern in the first group of input patterns, in accordance with a determination that the respective gate is in the subset of gates that meet the symmetry criteria, the device uses the respective representative symmetric gate value corresponding to the respective gate to determine a respective representative output value corresponding to the respective gate, generates a respective modified representative output value by applying the amplitude of the respective input pattern to the respective representative output value, and/or adds the respective modified representative output value to a respective total representative output value for a respective output pattern (e.g. as described with regard to operations 1422-1424 and 1478-1480). In some embodiments, in accordance with a determination that the respective gate is not in the subset of gates that meet the symmetry criteria, the device generates a respective set of gate-input-pattern values by combining the respective input pattern with the respective gate, and for each output pattern of a set of output patterns derived from the first group of input patterns, the device generates a respective set of gate-output-pattern values by applying the respective output pattern to the respective set of gate-input-pattern values; determines a respective representative output value that corresponds to the respective set of gate-output-pattern values; generates a respective modified representative output value by applying the amplitude of the respective input pattern to the respective representative output value; and adds the respective modified representative output value to the respective total representative output value for the respective output pattern (e.g., as described with regard to operations 1474-1480).

In some embodiments, for each gate and for each respective input pattern in the first group of input patterns, the device generates (1532) a respective set of gate-input-pattern values (e.g., matrix 808) by combining the respective input pattern (e.g., input pattern 124b) with the respective gate (e.g., beamsplitter 214). For each output pattern of a set of output patterns derived from the first group of input patterns, the device generates a set of gate-output-pattern values (e.g., matrix 1010) by applying the respective output pattern (e.g., output pattern 910) to the respective set of gate-input-pattern values (e.g., matrix 808). The device searches for a stored set of values that meets matching criteria for the respective set of gate-input-pattern values (e.g., matching criteria are met in accordance with a determination that at least a portion of at least one row of an array that corresponds to the stored set of values matches a corresponding row of the set of gate-input-pattern values (e.g., matrix 808) and/or in accordance with a determination that at least a portion of at least one column of an array that corresponds to the stored set of values matches a corresponding column (e.g., matrix 808) of the set of gate-input-pattern values). In accordance with a determination that a stored set of values meeting the matching criteria for gate-input-pattern values is found, the device uses the stored set of values to determine a representative output value that corresponds to the respective set of gate-output-pattern values (e.g. as described with regard to operations 1470-1472). For example, if representative output value is needed for a current set of gate-output patterns (e.g., matrix 1010) and a previously generated matrix is a submatrix of the current set of gate-output patterns, a representative output value stored for the previously generated matrix is used to calculate the representative output value for the current set of gate-output-pattern values. In accordance with a determination that no stored set of values meets the matching criteria for gate-input-pattern values, the device calculates a representative output value that corresponds to the respective set of gate-output-pattern values, the device stores the representative output value that corresponds to the respective set of gate-output-values (and information corresponding to the set of gate-output-values) (e.g., in accordance with a determination that representative output storage criteria are met (e.g., the set of gate-output-values has a minimum array size)), the device generates a modified representative output value by applying the amplitude of the respective input pattern to the representative output value; and the device adds the modified representative output value to a respective total representative output value for the respective output pattern (e.g., as described with regard to operations 1474-1480).

It should be understood that the particular order in which the operations in FIGS. 15A-15F have been described is merely an example and is not intended to indicate that the described order is the only order in which the operations could be performed. One of ordinary skill in the art would recognize various ways to reorder the operations described herein. Additionally, it should be noted that details of other processes described herein with respect to other methods described herein (e.g., methods 1400 and 1600) are also applicable in an analogous manner to method 1400 described above with respect to FIGS. 15A-15F.

FIG. 16 is a flow chart for a method 1600 of increasing a rate of simulation for quantum computing devices that include gates with predetermined sets of gate values, in accordance with some embodiments. The method is performed at computer system 100. For example, instructions for performing the method are stored in the memory 104 and executed by the processor(s) 102 of the computer system 100. In FIG. 16, dotted outlines indicate optional operations.

The method 1600 includes receiving (1602) a device definition for a quantum computing device (e.g., as described above with regard to operation 1502) and receiving (1604) state information for the quantum computing device (e.g., as described above with regard to operation 1504). For each gate of the plurality of gates, the device searches (1606) for a respective predetermined set of gate values that corresponds to the respective gate. For example, the device determines if the respective gate is a SWAP gate (e.g., as indicated at FIG. 12) or another common component. In accordance with a determination that a respective predetermined set of gate values that correspond to the respective gate is found, the device determines a respective output value for each input pattern of the plurality of input patterns using the predetermined set of gate values (e.g., as described with regard to operations 1426-1428). For example, a respective output value for each input pattern is determined as described with regard to FIG. 12. In accordance with a determination that a respective predetermined set of gate values that correspond to the respective gate is not found, the device generates a respective group of input patterns for the respective gate, wherein the respective group of input patterns includes a subset of the plurality of input patterns that meet grouping criteria.

It should be understood that the particular order in which the operations in FIG. 16 have been described is merely an example and is not intended to indicate that the described order is the only order in which the operations could be performed. One of ordinary skill in the art would recognize various ways to reorder the operations described herein. Additionally, it should be noted that details of other processes described herein with respect to other methods described herein (e.g., methods 1400 and 1500) are also applicable in an analogous manner to method 1600 described above with respect to FIG. 16.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

It will also be understood that, although the terms first, second, etc., are, in some instances, used herein to describe various elements, these elements should not be limited by these terms. These terms are only used to distinguish one element from another. For example, a first switch could be termed a second switch, and, similarly, a second switch could be termed a first switch, without departing from the scope of the various described embodiments. The first switch and the second switch are both switches, but they are not the same switch unless explicitly stated as such.

As used herein, the term "if" is, optionally, construed to mean "when" or "upon" or "in response to determining" or "in response to detecting" or "in accordance with a determination that," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method for increasing a rate of simulation for quantum computing devices, comprising:
   receiving a device definition for a quantum computing device, wherein:
      the quantum computing device includes a plurality of gates and a plurality of modes;
      each gate of the plurality of gates is coupled to a respective set of one or more of the plurality of modes; and
      the device definition includes a plurality of sets of gate values, wherein a respective set of gate values indicates modification by a respective gate of an input pattern probability;
   receiving state information, which includes:
      a plurality of input patterns, wherein each of the input patterns includes a respective plurality of input pattern values, wherein each input pattern value of the plurality of input pattern values indicates a number of input bosons that correspond to a respective mode of the plurality of modes; and
      a plurality of amplitudes, wherein each respective amplitude of the plurality of amplitudes indicates a probability associated with a respective input pattern of the plurality of input patterns;
   generating a first group of input patterns for a first gate, wherein the first group of input patterns includes a subset of the plurality of input patterns that meet grouping criteria; and
   performing a simulation of the quantum computing device and increasing the rate of simulation of the quantum computing device based on the first group of input patterns;
   wherein:
      a first criterion of the grouping criteria is satisfied in accordance with a determination that passive elements of the input patterns are identical, wherein passive elements for the first gate are input pattern values that correspond to respective modes that are not coupled to the first gate; and
      a second criterion of the grouping criteria is satisfied in accordance with a determination that sums of active elements of the input patterns are equal, wherein active elements for the first gate are input pattern values that correspond to respective modes that are coupled to the first gate.

2. The method of claim 1, wherein generating the first group of input patterns for the first gate includes ordering the input patterns in the first group of input patterns according to the active elements corresponding to a first mode of the first gate.

3. The method of claim 1, wherein the first gate is coupled to a first set of one or more modes of the plurality of modes, and generating the first group of input patterns comprises:
   in accordance with a determination that a second gate is a single mode gate that is coupled to a single mode from the plurality of modes:
      determining a set of elements of the first group of input patterns that correspond to the single mode;
      in accordance with a determination that each element in the set of elements is passive and zero, forgoing determining a representative output value that corresponds to the second gate;
      in accordance with a determination that each element in the set of elements is passive and non-zero, determining a representative output value using a respective input pattern of the plurality of input pattern values; and
      in accordance with a determination that each element of the set of elements is active, determining a representative output value using each non-zero element of the set of elements.

4. The method of claim 1, further comprising:
   detecting N identical input patterns of the plurality of input patterns, wherein N is an integer greater than one;
   removing, from the plurality of input patterns, N−1 of the N identical input patterns such that a single input pattern of the N identical input patterns remains in the plurality of input patterns; and
   setting an amplitude of the single remaining input pattern to a sum of amplitudes of the N identical input patterns.

5. The method of claim 1, further comprising:
   storing, in a first portion of memory, the plurality of input pattern values that correspond to an input state; and
   referencing a respective input pattern of the input state using a first index.

6. The method of claim 1, further comprising:
   storing, in a second portion of memory, a plurality of amplitudes that correspond to the plurality of input patterns; and
   referencing a respective amplitude of the plurality of amplitudes using a second index.

7. The method of claim 1, including:
determining, based on the received state information, a memory allocation amount; and
allocating memory based on the determined memory allocation amount.

8. The method of claim 1, wherein generating the first group of input patterns for the first gate includes:
determining a first set of modes that are coupled to the first gate;
searching for a stored set of modes that matches the first set of modes;
in accordance with a determination that a first stored set of modes matches the first set of modes, using a stored group of input patterns that corresponds to the first stored set of modes as the first group of input patterns; and
in accordance with a determination that no stored set of modes matches the first set of modes, storing the first set of modes.

9. The method of claim 1, further comprising:
for each input pattern of the first group of input patterns:
generating a respective set of gate-input-pattern values by combining the respective input pattern with the first gate; and
for each output pattern of a set of output patterns derived from the first group of input patterns:
generating a respective set of gate-output-pattern values by applying the respective output pattern to the respective set of gate-input-pattern values;
determining a representative output value that corresponds to the respective set of gate-output-pattern values;
generating a modified representative output value by applying the amplitude of the respective input pattern to the representative output value; and
adding the modified representative output value to a respective total representative output value for the respective output pattern.

10. The method of claim 9, further comprising:
identifying one or more output patterns in the set of output patterns that have an amplitude of zero; and
discarding the one or more zero-amplitude output patterns.

11. The method of claim 9, further comprising:
identifying a subset of the plurality of gates that share a predefined set of characteristics; and
storing a representative output value corresponding to the subset of the plurality of gates;
wherein generating the modified representative output value includes:
searching for a stored representative output value that corresponds to the first gate; and
in accordance with a determination that a stored gate transfer value corresponding to the first gate is found:
forgoing generating the set of gate-input-pattern values;
forgoing generating the set of gate-output-pattern values;
forgoing determining the representative output value that corresponds to the respective set of gate-output-pattern values; and
generating the modified representative output value by applying the amplitude of the respective input pattern to the stored representative output value.

12. The method of claim 1, further comprising:
determining a subset of gates of the plurality of gates that meet symmetry criteria;
storing a respective representative symmetric gate value for each gate of the subset of gates; and
for each gate and for each input pattern in the first group of input patterns:
in accordance with a determination that the respective gate is in the subset of gates that meet the symmetry criteria:
using the respective representative symmetric gate value corresponding to the respective gate to determine a respective representative output value corresponding to the respective gate;
generating a respective modified representative output value by applying the amplitude of the respective input pattern to the respective representative output value;
adding the respective modified representative output value to a respective total representative output value for a respective output pattern; and
in accordance with a determination that the respective gate is not in the subset of gates that meet the symmetry criteria:
generating a respective set of gate-input-pattern values by combining the respective input pattern with the respective gate; and
for each output pattern of a set of output patterns derived from the first group of input patterns:
generating a respective set of gate-output-pattern values by applying the respective output pattern to the respective set of gate-input-pattern values;
determining a respective representative output value that corresponds to the respective set of gate-output-pattern values;
generating a respective modified representative output value by applying the amplitude of the respective input pattern to the respective representative output value; and
adding the respective modified representative output value to the respective total representative output value for the respective output pattern.

13. The method of claim 1, further comprising:
for each gate and for each respective input pattern in the first group of input patterns:
generating a respective set of gate-input-pattern values by combining the respective input pattern with the respective gate; and
for each output pattern of a set of output patterns derived from the first group of input patterns:
generating a respective set of gate-output-pattern values by applying the respective output pattern to the respective set of gate-input-pattern values;
searching for a stored set of values that meets matching criteria for the respective set of gate-input-pattern values;
in accordance with a determination that a stored set of values meeting the matching criteria for gate-input-pattern values is found, using the stored set of values to determine a representative output value that corresponds to the respective set of gate-output-pattern values;
in accordance with a determination that no stored set of values meets the matching criteria for gate-input-pattern values, calculating a representative output value that corresponds to the respective set of gate-output-pattern values;

generating a modified representative output value by applying the amplitude of the respective input pattern to the representative output value; and adding the modified representative output value to a respective total representative output value for the respective output pattern.

14. A method for increasing a rate of simulation for quantum computing devices, comprising:

receiving a device definition for a quantum computing device, wherein:
the quantum computing device includes a plurality of gates and a plurality of modes;
each gate of the plurality of gates is coupled to one or more of the plurality of modes; and
the device definition includes a plurality of sets of gate values, wherein each set of gate values indicates modification by a respective gate of an input pattern probability;

receiving state information, which includes:
a plurality of input patterns, wherein each of the input patterns includes a respective plurality of input pattern values, wherein each input pattern value of the plurality of input pattern values indicates a number of input bosons that correspond to a respective mode of the plurality of modes; and
a plurality of amplitudes, wherein each respective amplitude of the plurality of amplitudes indicates a probability associated with a respective input pattern of the plurality of input patterns;

for each gate of the plurality of gates:
searching for a respective predetermined set of gate values that corresponds to the respective gate;
in accordance with a determination that a respective predetermined set of gate values that correspond to the respective gate is found, determining a respective output value for each input pattern of the plurality of input patterns using the predetermined set of gate values; and
in accordance with a determination that a respective predetermined set of gate values that correspond to the respective gate is not found, generating a respective group of input patterns for the respective gate, wherein the respective group of input patterns includes a subset of the plurality of input patterns that meet grouping criteria; and performing a simulation of the quantum computing device and increasing the rate of simulation of the quantum computing device based on the plurality of input patterns.

15. A system, comprising:
one or more processors;
memory; and
one or more programs, wherein the one or more programs are stored in the memory, and when executed by one or more processors, the one or more programs are configured to perform:
receiving a device definition for a quantum computing device, wherein:
the quantum computing device includes a plurality of gates and a plurality of modes;
each gate of the plurality of gates is coupled to a respective set of one or more of the plurality of modes; and
the device definition includes a plurality of sets of gate values, wherein a respective set of gate values indicates modification by a respective gate of a probability that corresponds to a respective input pattern;
receiving state information, which includes:
a plurality of input patterns, wherein each of the input patterns includes a respective plurality of input pattern values, wherein each input pattern value of the plurality of input pattern values indicates a number of input bosons that correspond to a respective mode of the plurality of modes; and
a plurality of amplitudes, wherein each respective amplitude of the plurality of amplitudes indicates a probability associated with a respective input pattern of the plurality of input patterns;
generating a first group of input patterns for a first gate, wherein the first group of input patterns includes a subset of the plurality of input patterns that meet grouping criteria; and
performing a simulation of the quantum computing device and increasing the rate of simulation of the quantum computing device based on the first group of input patterns;
detecting N identical input patterns of the plurality of input patterns, wherein N is an integer greater than one;
removing, from the plurality of input patterns, N−1 of the N identical input patterns such that a single input pattern of the N identical input patterns remains in the plurality of input patterns; and
setting an amplitude of the single remaining input pattern to a sum of amplitudes of the N identical input patterns.

16. A non-transitory computer readable storage medium storing one or more programs, the one or more programs comprising instructions, which when executed, cause a device to:
receive a device definition for a quantum computing device, wherein:
the quantum computing device includes a plurality of gates and a plurality of modes;
each gate of the plurality of gates is coupled to a respective set of one or more of the plurality of modes; and
the device definition includes a plurality of sets of gate values, wherein a respective set of gate values indicates modification by a respective gate of a probability that corresponds to a respective input pattern;
receive state information, which includes:
a plurality of input patterns, wherein each of the input patterns includes a respective plurality of input pattern values, wherein each input pattern value of the plurality of input pattern values indicates a number of input bosons that correspond to a respective mode of the plurality of modes; and
a plurality of amplitudes, wherein each respective amplitude of the plurality of amplitudes indicates a probability associated with a respective input pattern of the plurality of input patterns;
generate a first group of input patterns for a first gate, wherein the first group of input patterns includes a subset of the plurality of input patterns that meet grouping criteria;
perform a simulation of the quantum computing device and increase the rate of simulation of the quantum computing device based on the first group of input patterns;

determine a first set of modes that are coupled to the first gate;

search for a stored set of modes that matches the first set of modes;

in accordance with a determination that a first stored set of modes matches the first set of modes, use a stored group of input patterns that corresponds to the first stored set of modes as the first group of input patterns; and in accordance with a determination that no stored set of modes matches the first set of modes, store the first set of modes.

* * * * *